United States Patent
Moon et al.

(10) Patent No.: US 11,309,013 B2
(45) Date of Patent: Apr. 19, 2022

(54) MEMORY DEVICE FOR REDUCING RESOURCES USED FOR TRAINING

(71) Applicant: Samsung Electronics Co., Ltd., Suwon-si (KR)

(72) Inventors: Byongmo Moon, Seoul (KR); Beomyong Kil, Suwon-si (KR); Jihye Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/130,493

(22) Filed: Dec. 22, 2020

(65) Prior Publication Data

US 2021/0343325 A1 Nov. 4, 2021

(30) Foreign Application Priority Data

Apr. 29, 2020 (KR) .......................... 10-2020-0052587
Jul. 22, 2020 (KR) .......................... 10-2020-0091254

(51) Int. Cl.
| | |
|---|---|
| *G11C 5/14* | (2006.01) |
| *G11C 11/4074* | (2006.01) |
| *G11C 8/18* | (2006.01) |
| *G11C 11/4076* | (2006.01) |
| *G11C 11/409* | (2006.01) |

(52) U.S. Cl.
CPC ............ *G11C 11/4074* (2013.01); *G11C 8/18* (2013.01); *G11C 11/409* (2013.01); *G11C 11/4076* (2013.01)

(58) Field of Classification Search
CPC ... G11C 11/4074; G11C 8/18; G11C 11/4076; G11C 11/409

USPC ......................................................... 365/226
See application file for complete search history.

(56) References Cited

U.S. PATENT DOCUMENTS

| | | | | |
|---|---|---|---|---|
| 5,604,710 | A | * | 2/1997 | Tomishima ............ G11C 5/025 365/201 |
| 7,103,792 | B2 | | 9/2006 | Moon |
| 8,310,854 | B2 | * | 11/2012 | MacWilliams ..... G06F 12/0646 365/52 |
| 8,725,976 | B2 | | 5/2014 | Cho et al. |
| 9,720,439 | B2 | | 8/2017 | Tennant |

(Continued)

FOREIGN PATENT DOCUMENTS

| KR | 10-0454126 B1 | 10/2004 |
|---|---|---|
| WO | WO-2014/115599 A1 | 7/2014 |

OTHER PUBLICATIONS

Extended European Search Report dated Sep. 1, 2021 issued in corresponding European Application No. 21169529.1-1203.

*Primary Examiner* — Huan Hoang
(74) *Attorney, Agent, or Firm* — Harness, Dickey & Pierce, P.L.C.

(57) ABSTRACT

A memory device includes: first power pins in a first power area and configured to receive a first power voltage; data pins configured to transmit or receive data signals, the data pins being arranged in a first region and in a second region each including the first power area; control pins configured to transmit or receive control signals in the first region and in the second region; second power pins in a second power area between the first region and the second region and configured to receive a second power voltage different from the first power voltage; and ground pins in the second power area and configured to receive a ground voltage.

20 Claims, 19 Drawing Sheets

(56) References Cited

U.S. PATENT DOCUMENTS

| | | |
|---|---|---|
| 10,203,875 B1 | 2/2019 | Ying et al. |
| 10,380,046 B2 | 8/2019 | Iyer et al. |
| 2007/0083491 A1* | 4/2007 | Walmsley ............. G06F 21/608 |
| 2014/0181451 A1 | 6/2014 | Malladi et al. |
| 2019/0079699 A1 | 3/2019 | Lee et al. |
| 2019/0130950 A1 | 5/2019 | Kim et al. |
| 2020/0133540 A1 | 4/2020 | Pilolli et al. |

* cited by examiner

MEMORY DEVICE FOR REDUCING RESOURCES USED FOR TRAINING

CROSS-REFERENCE TO RELATED APPLICATIONS

This application claims priority under § 119 to a Korean Patent Application No. 10-2020-0052587 filed on Apr. 29, 2020, and a Korean Patent Application No. 10-2020-0091254 filed on Jul. 22, 2020, in the Korean Intellectual Property Office, the disclosures of each of which are incorporated herein in their entirety by reference.

BACKGROUND

Example embodiments relate to a semiconductor device, and more particularly, to a memory device for reducing resources used for training.

Electronic devices such as smartphones, graphics accelerators, and/or artificial intelligence (AI) accelerators process data using memory devices such as Dynamic Random Access Memory (DRAM). As the amount of data to be processed by the electronic devices increases, a memory device having high capacity and high bandwidth is required. In particular, in order to process data at high speed, the use of memory devices that provide wide input/output of a multi-channel interface method such as High Bandwidth Memory (HBM) has increased.

The memory device may exchange data with an external device (e.g., a host device or a memory controller) through a plurality of data pins to provide high bandwidth. As the number of data pins of the memory device increases, the external device can process data at a high speed. However, when training is performed for each pin, the training may take a long time and resources used for training may increase as the number of data pins increases.

SUMMARY

Example embodiments may provide a memory device capable of performing training for a plurality of data pins by each group to reduce training resources for the plurality of data pins.

According to some example embodiments, a memory device includes first power pins in a first power area and configured to receive a first power voltage, data pins configured to transmit or receive data signals, the data pins in a first region and a second region, the first region and the second region each including a portion of the first power area, control pins configured to transmit or receive control signals, the control pins in the first region and the second region, second power pins in a second power area between the first region and the second region, the second power pins configured to receive a second power voltage different from the first power voltage, and ground pins in the second power area and configured to receive a ground voltage, The data pins and the control pins are divided into a plurality of pin groups, and a training value corresponding to each of the plurality of pin groups is based on training with regard to at least one pin from among pins of each of the plurality of pin groups.

According to some example embodiments, a memory device includes a first pin group including a first data pin configured to transmit or receive a first data signal and a first control pin configured to transmit or receive a first control signal, a second pin group including a second data pin configured to transmit or receive a second data signal and a second control pin configured to transmit or receive a second control signal, a third control pin configured to receive a write data strobe signal, first power pins configured to receive a first power voltage, second power pins configured to receive a second power voltage different from the first power voltage, ground pins configured to receive a ground voltage, and a write data strobe tree circuitry configured to transmit a first internal write data strobe signal with a first toggle timing to a first circuit block corresponding to the first pin group and to transmit a second internal write data strobe signal with a second toggle timing to a second circuit block corresponding to the second pin group, based on the write data strobe signal. The first power pins are located in a first power area positioned in each of a first region in which the first pin group is located and a second region in which the second pin group is located. The second power pins are located in a second power area positioned between the first region and the second region. The ground pins being located in the second power area. The first toggle timing is different from the second toggle timing.

According to some example embodiments, a memory device includes a write data strobe pin configured to receive a write data strobe signal, a first group of pins configured to receive first data signals sampled based on the write data strobe signal, and a second group of pins configured to receive second data signals sampled based on the write data strobe signal. A first training value corresponding to the first group of pins is based on training with respect to a first pin from among the first pin groups, and a second training value corresponding to the second group of pins is based on training with respect to a second pin of the second group of pins.

According to some example embodiments, a memory system includes a memory device configured to receive a write data strobe signal through a write data strobe pin, to receive first data signals through pins of a first pin group corresponding to the write data strobe pin, and to receive second data signals through pins of a second pin group corresponding to the write data strobe pin, and a memory controller configured to transmit the first data signals to the memory device based on a first transmission timing determined through training with respect to one pin of the first pin group and to transmit the second data signals to the memory device based on a second transmission timing determined through training with respect to one pin of the second pin group while transmitting the toggling write data strobe signal to the memory device.

According to some example embodiments, a memory system includes a memory device configured to receive a write data strobe signal through a write data strobe pin, to transmit first data signals through a first pin group corresponding to the write data strobe pin, and to transmit second data signals through a second pin group corresponding to the write data strobe pin, and a memory controller configured to transmit the toggling write data strobe signal to the memory device, to sample the first data signals received from the memory device based on a first receiving timing determined through training with respect to one pin of the first pin group, and to sample the second data signals received from the memory device based on a second receiving timing determined through training with respect to one pin of the second pin group.

According to some example embodiments, a memory system includes an interposer substrate, a system-on-chip stacked on the interposer substrate and including at least one processor, and a memory device stacked on the interposer substrate and including (a) a buffer die configured to communicate first signals with the system-on-chip through a first bump group and to communicate second signals with the system-on-chip through a second bump group and (b) a plurality of core dies stacked on the buffer die through a silicon through electrode and each including memory cells. The system-on-chip is configured to communicate the first signals with the buffer die based on a first training result determined through training on a first bump of the first bump group, and to communicate the second signals with the buffer die based on a second training result determined through training with respect to a second bump of the second bump group.

According to some example embodiments, a Dynamic Random Access Memory (DRAM) device includes a clock terminal configured to receive a clock signal, a data clock terminal configured to receive a data clock signal, and an m-number of unit blocks coupled to the data clock signal, each of the m-number of unit blocks on a monolithic silicon substrate and in a shifted and/or mirrored relationship with other unit blocks, and each unit block including n-number of data terminals configured to respectively receive n-number of data signals, m and n are integers greater than or equal to three. Each of the m-number of unit blocks is configured to perform a data bus training affecting a timing window between the data clock signal and a representative data signal, and the representative data signal is a representative one out of the n number of data signals in the unit block in which the data bus training is performed.

BRIEF DESCRIPTION OF THE DRAWINGS

Some example embodiments of inventive concepts will be more clearly understood from the following detailed description taken in conjunction with the accompanying drawings in which.

DETAILED DESCRIPTION OF THE EMBODIMENTS

In the following, example embodiments illustrating the inventive concepts will be described in detail so that those skilled in the art easily carry out the inventive concepts.

Figure 1:
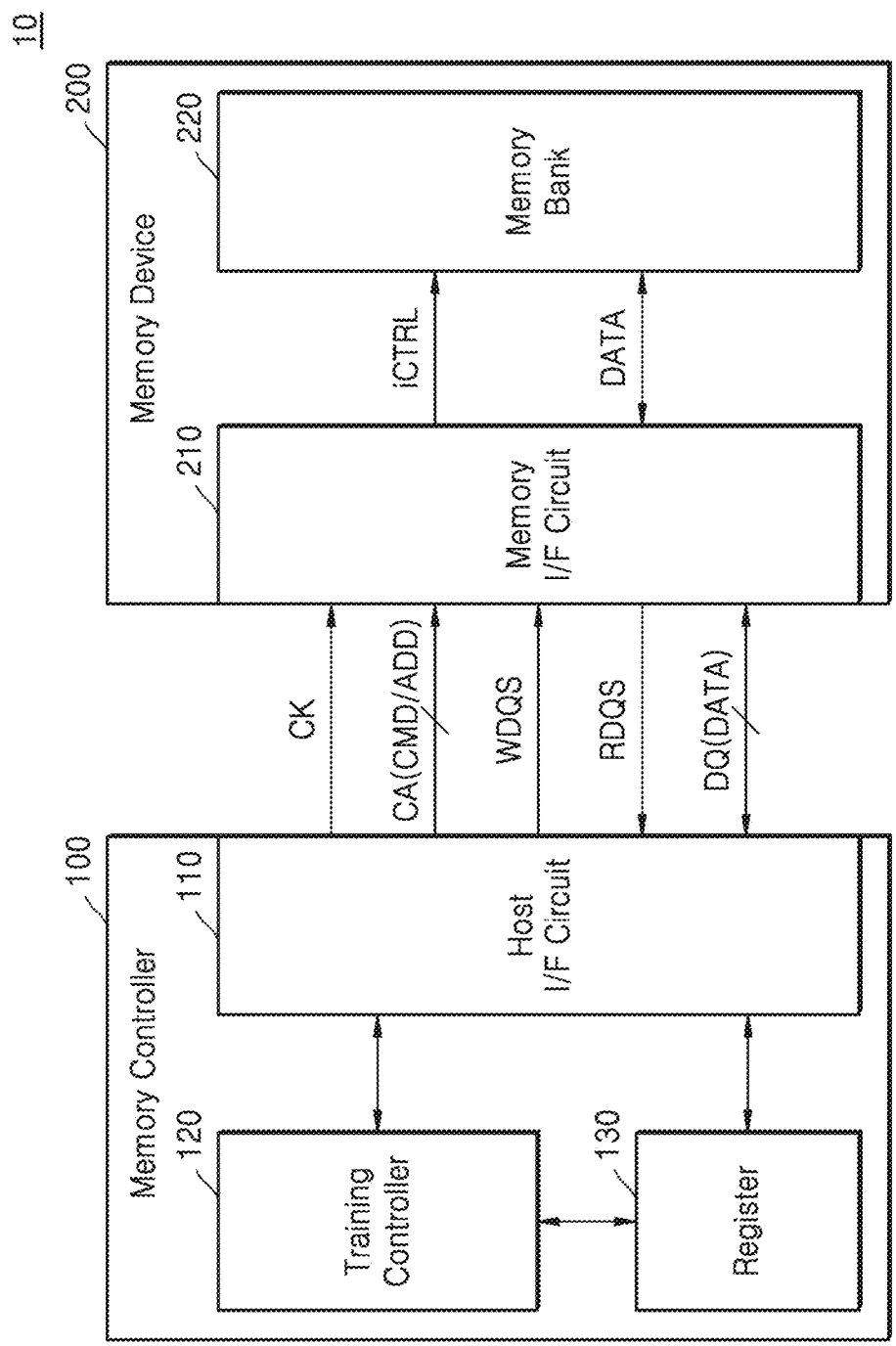
FIG. 1 is a block diagram illustrating a memory system according to an example embodiment.

FIG. 1 is a block diagram illustrating a memory system according to an example embodiment. Referring to FIG. 1, a memory system 10 may include a memory controller 100 and a memory device 200. The memory controller 100 may control the overall operation of the memory device 200. For example, the memory controller 100 may control the memory device 200 such that data is output from the memory device 200 and/or data is stored in the memory device 200. The memory controller 100 may be implemented as part of a system-on-chip (SoC), but example embodiments are not limited thereto.

The memory controller 100 may include a host interface circuit 110, a training controller 120, and a register 130. The host interface circuit 110 may generate a clock signal CK and transmit the clock signal CK to the memory device 200. The clock signal CK may be a signal that periodically toggles between a high level and a low level. The host interface circuit 110 may transmit command/address signals CA including a command CMD and/or an address ADD to the memory device 200 based on the toggle timing of the clock signal CK. The command/address signals CA may be transmitted to the memory device 200 through a plurality of signal lines.

The host interface circuit 110 may also generate a write data strobe signal WDQS and transmit the write data strobe signal WDQS to the memory device 200. The write data strobe signal WDQS may be or correspond to a signal that periodically toggles between a high level and a low level (See FIG. 8). The host interface circuit 110 may transmit data signals DQ including the data DATA to the memory device 200 based on the toggle timing of the write data strobe signal WDQS. The data signals DQ may be transmitted to the memory device 200 through a plurality of signal lines.

The host interface circuit 110 may receive a read data strobe signal RDQS from the memory device 200. The read data strobe signal RDQS may be or correspond to a signal that periodically toggles between a high level and a low level. The host interface circuit 110 may receive the data signals DQ from the memory device 200 and sample the data signals DQ based on the toggle timing of the read data strobe signal RDQS. Accordingly, the host interface circuit 110 may obtain data DATA from the data signals DQ.

The training controller 120 may control training operations for the memory device 200. The training controller 120 may determine a training value through training the memory device 200. Specifically, the training controller 120 determining the training value represents the training controller 120 determining the transmission timing of each of the data signals DQ transmitted from the host interface circuit 110, and determining the receiving timing of each of the data signals DQ received by the host interface circuit 110. Accordingly, transmission timing information and receiving timing information on the data signals DQ may be generated. Here, the transmission timing corresponds to a timing for the host interface circuit 110 to transmit the data signals DQ including the data DATA to the memory device 200, and the specific time (or timing) at which the data DATA is transmitted to the memory device 200 may vary according to the transmission timing. The receiving timing corresponds to a timing for the host interface circuit 110 to sample the data signals DQ received from the memory device 200, and the specific time (or timing) at which each of the data signals DQ is sampled may vary according to the receiving timing.

The training controller 120 may be implemented with hardware including analog circuits and/or digital circuits, and/or may be implemented with software including a plurality of instructions executed by a central processing unit (CPU) inside the memory controller 100.

The register 130 may store training values generated from the training controller 120. For example, the register 130 may store transmission timing information and receiving timing information generated through training.

In some example embodiments, after the training, the host interface circuit 110 may transmit data signals DQ based on the transmission timing information stored in the register 130, and may receive data signals DQ based on the receiving timing information stored in the register 130. The host interface circuit 110 may adjust the transmission and reception time of the data signals DQ according to the transmission timing information and the receiving timing information, respectively. For example, the host interface circuit 110 may delay the transmission time of each of the data signals DQ according to the transmission timing information on the data signals DQ. In this case, a time at which data DATA included in the data signals DQ is transmitted to the memory device 200 may be delayed. The host interface circuit 110 may delay the reception time of the data signals DQ according to the receiving timing information. In this case, a time at which the data DATA included in the data signals DQ is obtained from the memory controller 100 may be delayed.

The memory device 200 may operate under the control of the memory controller 100. For example, the memory device 200 may output stored data and/or may store data provided from the memory controller 100 under the control of the memory controller 100.

The memory device 200 may include a memory interface circuit 210 and a memory bank 220. The memory interface circuit 210 may receive a clock signal CK from the memory controller 100. The memory interface circuit 210 may receive command/address signals CA from the memory controller 100. The memory interface circuit 210 may sample the command/address signals CA based on the toggle timing (e.g., a rising edge and/or a falling edge) of the clock signal CK. Accordingly, the memory interface circuit 210 may obtain a command CMD and/or an address ADD included in the command/address signals CA.

FIG. 1 shows that the command CMD and the address ADD are transmitted from the memory controller 100 to the memory device 200 through the same channel (e.g., command/address signals CA) but the example embodiment is not limited to this. For example, the command CMD and the address ADD may be transmitted from the memory controller 100 to the memory device 200 using different channels.

The memory interface circuit 210 may receive a write data strobe signal WDQS and data signals DQ from the memory controller 100. The memory interface circuit 210 may sample the data signals DQ based on the toggle timing (e.g., a rising edge and/or a falling edge) of the write data strobe signal WDQS. Accordingly, the memory interface circuit 210 may obtain data DATA from the data signals DQ based on the sampling.

The memory interface circuit 210 may generate a read data strobe signal RDQS and transmit the read data strobe signal RDQS to the memory controller 100. The read data strobe signal RDQS may correspond to a signal that periodically toggles between a high level and a low level. In some example embodiments, the memory interface circuit 210 may generate a read data strobe signal RDQS based on the write data strobe signal WDQS received from the memory controller 100. The memory interface circuit 210 may transmit data signals DQ to the memory controller 100 based on toggle timing of the write data strobe signal WDQS. Accordingly, the data signals DQ may be aligned with edge timing of the read data strobe signal RDQS and transmitted to the memory controller 100. However, example embodiments are not limited thereto, and the memory interface circuit 210 may generate a read data strobe signal RDQS based on the clock signal CK, and transmit data signals DQ to the memory controller 100 based on the read data strobe signal RDQS.

In some example embodiments, each of the write data strobe signal WDQS and the read data strobe signal RDQS may have a frequency which is two times greater than (double of) the frequency of the clock signal CK. For example, the frequency of the clock signal CK may be 1.6 GHz, and the frequency of each of the write data strobe signal WDQS and the read data strobe signal RDQS may be 3.2 GHz. However, example embodiments are not limited thereto, and the frequency of each of the write data strobe signal WDQS and the read data strobe signal RDQS may be N times (N is a natural number greater than or equal to two) the frequency of the clock signal CK.

The memory interface circuit 210 may generate a control signal iCTRL based on the command CMD and the address ADD received from the memory controller 100 and may provide the control signal iCTRL to the memory bank 220. For example, the control signal iCTRL may include a row address and a column address. However, the example embodiments are not limited thereto.

The memory bank 220 may include a plurality of memory cells connected to word lines and bit lines. For example, each of the plurality of memory cells may be or correspond to a dynamic random access memory (DRAM) cell, e.g., a one-transistor/one capacitor DRAM cell. In this case, the host interface circuit 110 and the memory interface circuit 210 may communicate input/output signals based on one of standards such as Double Data Rate (DDR), Low Power Double Data Rate (LPDDR), Graphics Double Data Rate (GDDR), Wide I/O, High Bandwidth Memory (HBM), Hybrid Memory Cube (HMC), or the like. However, example embodiments are not limited thereto, and each of the plurality of memory cells may be various types of memory cells such as a resistive RAM (RRAM) cell.

The memory bank 220 may write data DATA to memory cells or read data DATA from memory cells in response to the control signal iCTRL. Although not shown in FIG. 1, the memory bank 220 may further include a row decoder, a column decoder, and a sense amplifier for write and/or read operations.

As described above, the memory controller 100 and the memory device 200 may transmit and receive data signals DQ based on the transmission timing and the receiving timing determined through training. However, example embodiments are not limited thereto. The training controller 120 may determine transmission timing and/or receiving timing of various input/output signals transmitted or received based on the clock signal CK, the write data strobe signal WDQS, and/or the read data strobe signal RDQS in addition to the data signals DQ through training. For example, the training controller 120 may determine transmission timing and/or receiving timing of the command/address signals CA and various control signals (e.g., data bus inversion (DBI), data parity (DPAR), and the like) transmitted and/or received between the memory controller 100 and the memory device 200. In the following, for convenience of description, some example embodiments will be described in detail based on the data signals DQ, but example embodiments are not limited thereto, and example embodiments to be described below may be applied to various input/output signals including the command/address signals CA.

Figure 2:
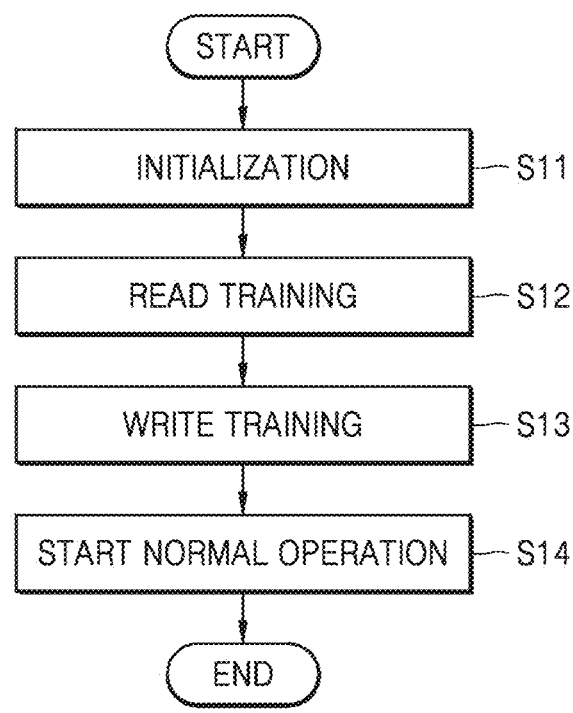
FIG. 2 is a flowchart illustrating an example operation of the memory system of FIG. 1.

FIG. 2 is a flowchart illustrating an example operation of the memory system of FIG. 1. Referring to FIGS. 1 and 2, in operation S11, the memory system 10 may perform initialization. When the memory system 10 is powered-up, the memory controller 100 and the memory device 200 may perform initialization according to a predetermined method. During the initialization, for example, the memory controller 100 may provide a power voltage to the memory device 200, perform various initial setting operations, and read necessary information from the memory device 200.

In operation S12, the memory system 10 may perform a read training operation. In order to optimize (or, improve) the signal integrity or data-eye of the data DATA received from the memory device 200 to the memory controller 100, the memory controller 100 may determine receiving timing for the data signals DQ, and generate receiving timing information.

In operation S13, the memory system 10 may perform a write training operation. In order to optimize (or, improve) the signal integrity or data-eye of data DATA transmitted to the memory device 200 from the memory controller 100, the memory controller 100 may determine transmission timing for the data signals DQ, and generate transmission timing information.

After the initialization and (read and write) training operation of operations S11 to S13 described above are performed, in operation S14, the memory system 10 may perform a normal operation. For example, the memory controller 100 may obtain the data DATA by sampling the data signals DQ received from the memory device 200 based on the receiving timing determined according to the read training operation. The memory controller 100 may transmit the data signals DQ to the memory device 200 based on the transmission timing determined according to the write training operation.

In some example embodiments, before operation S12, the memory system 10 may determine the transmission timing of the command/address signal CA by performing training on the command/address signal CA. In some example embodiments, before operation S12, the memory system 10 performs training on the write data strobe signal WDQS so that the toggle timing of the clock signal CK and the toggle timing of the write data strobe signal WDQS are aligned.

Figure 3:
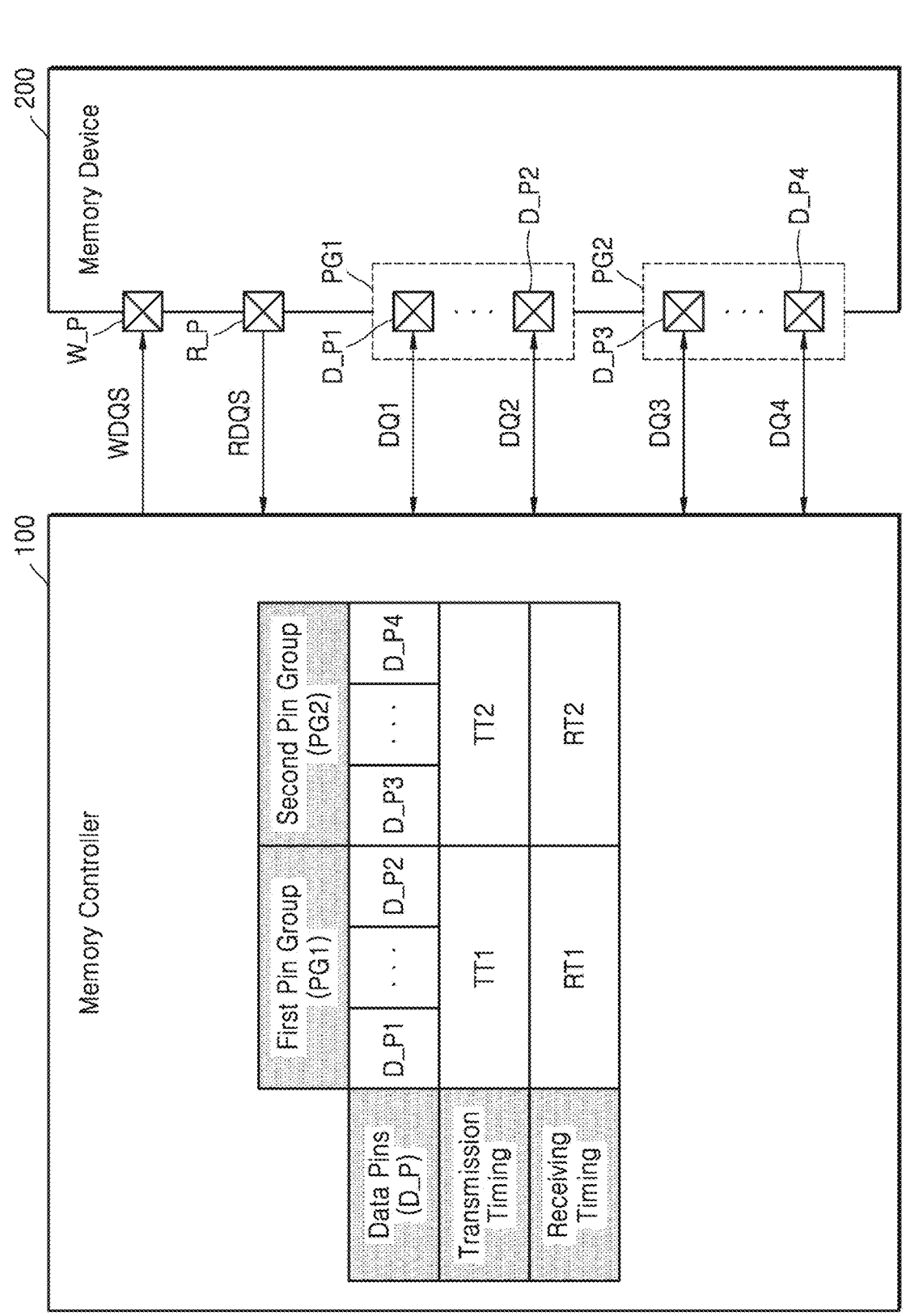
FIG. 3 is a diagram illustrating an example of a read training operation and a write training operation of the memory system of FIG. 1.

FIG. 3 is a diagram illustrating an example of a read training operation and a write training operation of the memory system of FIG. 1. Referring to FIG. 3, the memory device 200 may include a write data strobe pin W_P, a read data strobe pin R_P, and data pins D_P. The memory controller 100 may transmit a write data strobe signal WDQS to the memory device 200 through a write data strobe pin W_P, and receive a read data strobe signal RDQS from the memory device 200 through a read data strobe pin R_P. The memory controller 100 may transmit data signals DQ to the memory device 200 through the data pins D_P and/or may receive data signals DQ from the memory device 200.

The data pins D_P of the memory device 200 may be divided into a first pin group PG1 and a second pin group PG2. Each of the first pin group PG1 and the second pin group PG2 may include at least two data pins (e.g., at least or exactly eight data pins). For example, the first pin group PG1 may include a first data pin D_P1 and a second data pin D_P2, and the second pin group PG2 may include a third data pin D_P3 and a fourth data pin D_P4. For example, the first data pin D_P1 and the second data pin D_P2 may be positioned adjacent to each other, and the third data pin D_P3 and the fourth data pin D_P4 may be positioned to be adjacent to each other. The memory controller 100 may transmit the first to fourth data signals DQ1 to DQ4 to the memory device 200 through the first to fourth data pins D_P1 to D_P4, or receive the first to fourth data signals DQ1 to DQ4 from the memory device 200.

The memory controller 100 may store group information on pins of the memory device 200. For example, the memory controller 100 may store information on data pins D_P included in the first pin group PG1 and the second pin group PG2. For example, group information on pins may be predetermined by standards. For example, group information on pins may be stored in the register 130 of FIG. 1.

The memory controller 100 may perform training for each pin group. The memory controller 100 may determine a first transmission timing TT1 corresponding to the first pin group PG1 by performing a write training operation on the first pin group PG1, and determine a second transmission timing TT2 corresponding to the second pin group PG2 by performing a write training operation on the second pin group PG2. The determined transmission timing TT1 and TT2 may be stored in the register 130 corresponding to the first pin group PG1 and the second pin group PG2, respectively. Transmission timing of the data pins D_P included in one pin group may be determined identically. For example, the transmission timing of the first data pin D_P1 and the transmission timing of the second data pin D_P2 may be determined by the same value (e.g. the first transmission timing TT1). The memory controller 100 may determine a first receiving timing RT1 corresponding to the first pin group PG1 by performing a read training operation on the first pin group PG1, and determine a second receiving timing RT2 corresponding to the second pin group PG2 by performing a read training operation on the second pin group PG2. The determined receiving timing RT1 and RT2 may be stored in the register 130 corresponding to the first pin group PG1 and the second pin group PG2, respectively. Receiving timing of the data pins D_P included in one pin group may be determined identically. For example, the receiving timing of the first data pin D_P1 and the receiving timing of the second data pin D_P2 may be determined by the same value (e.g. the first receiving timing TT1). Accordingly, transmission timing and receiving timing may be determined for each pin group.

According to some example embodiments, training for a pin group may be performed by training for a specific pin among pins of the pin group. The training value (e.g. transmission timing or receiving timing) for the specific pin may be used for the pin group. The training operation for a specific pin of the memory device 200 refers to an operation of determining an optimal transmission timing of a signal transmitted to a specific pin and/or refers to an operation of determining an optimal receiving timing of a signal received through a specific pin.

In the write operation after training, the memory controller 100 may transmit the first data signal DQ1 and the second data signal DQ2 to the memory device 200 based on the first transmission timing TT1 and may transmit the third data signal DQ3 and the fourth data signal DQ4 to the memory device 200 based on the second transmission timing TT2. The memory device 200 may sample each of the first to fourth data signals DQ1 to DQ4 based on the write data strobe signal WDQS.

In a read operation after training, the memory device 200 may transmit the first to fourth data signals DQ1 to DQ4 to the memory controller 100. The memory controller 100 may sample the first data signal DQ1 and the second data signal DQ2 based on the first receiving timing RT1 using the read strobe signal RDQS, and may sample the third data signal DQ3 and the fourth data signal DQ4 based on the second receiving timing RT2.

FIG. 3 illustrates that the data pins D_P are divided into two pin groups PG1 and PG2, but example embodiments are not limited thereto. For example, the data pins D_P may be divided into three or more pin groups.

As described above, according to some example embodiments of inventive concepts, training may be performed for each group of data pins D_P. In this case, the memory controller 100 may store the transmission timing and receiving timing for each group, without having to store the transmission timing and receiving timing for each of the data pins D_P. Therefore, when training is performed for each group on the data pins D_P, the training speed may be improved compared to when training is performed, e.g. performed separately, for each pin for the data pins D_P, and/or the capacity of the register 130 for storing the transmission timing and the receiving timing may be reduced. Accordingly, resources used for training may be reduced.

Figure 4:
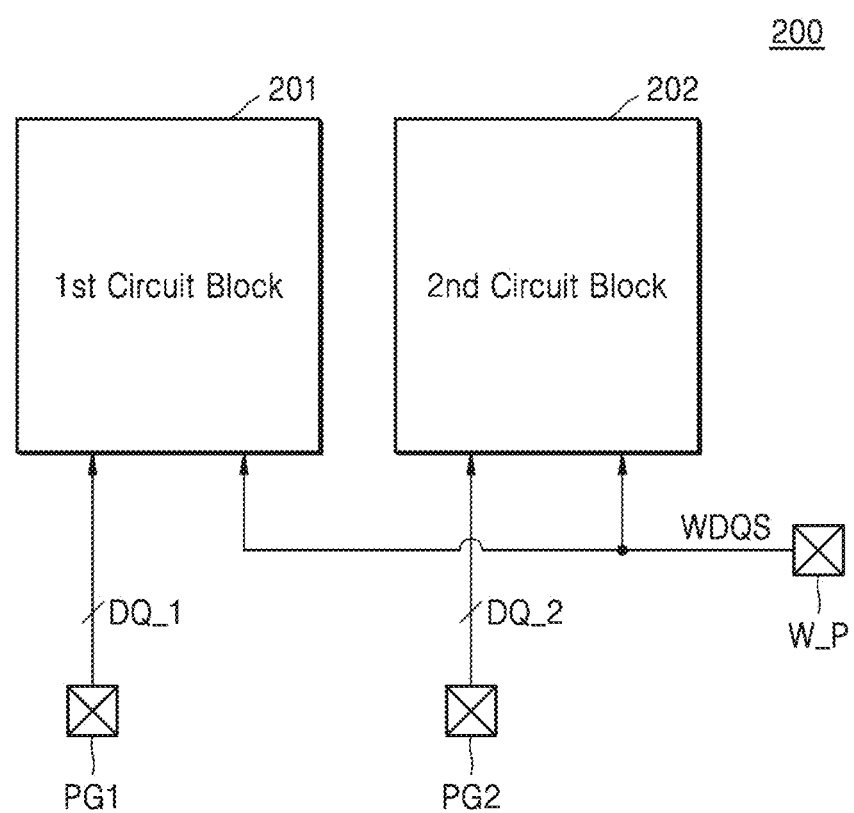
FIG. 4 is a block diagram of the memory device of FIG. 3 according to an example embodiment.

FIG. 4 is an example block diagram of the memory device of FIG. 3. Referring to FIGS. 3 and 4, the memory device 200 may include a first pin group PG1, a second pin group PG2, and a write data strobe pin W_P, and may also include a first circuit block 201 and a second circuit block 202. The first circuit block 201 may receive the first data signals DQ_1 through the first pin group PG1 and may receive the write data strobe signal WDQS through the write data strobe pin W_P. The second circuit block 202 may receive the second data signals DQ_2 through the second pin group PG2 and may receive the write data strobe signal WDQS through the write data strobe pin W_P. For example, the first circuit block 201 and the second circuit block 202 may operate based on one write data strobe signal WDQS.

The first circuit block 201 may sample the first data signals DQ_1 based on the write data strobe signal WDQS. In this case, the first data signals DQ_1 may be transmitted from the memory controller 100 based on one training value (e.g., the first transmission timing TT1). The second circuit block 202 may sample the second data signals DQ_2 based on the write data strobe signal WDQS. In this case, the second data signals DQ_2 may be transmitted from the memory controller 100 based on one training value (e.g., the second transmission timing TT2).

In some example embodiments, each of the first circuit block 201 and the second circuit block 202 may include a phase comparator. Each of the first circuit block 201 and the second circuit block 202 may compare the phase of the write data strobe signal WDQS and the data signal received through the data pin through a phase comparator in a training process for the data pin. For example, a phase comparison result may be generated by sampling the data signal based on the write data strobe signal WDQS through the phase comparator. The memory controller 100 may determine a training value for the data pin based on the result of the phase comparison. For example, the memory controller 100 may transmit a data signal to the memory device 200 by varying the phase (i.e. timing) of the data signal. The memory controller 100 may receive phase comparison results corresponding to various phases (i.e. timing) from the memory device 200. The memory controller 100 may determine a training value such that a timing window between the write data strobe signal WDQS and the data signal among the phase comparison results is maximized.

In some example embodiments, the first pin group PG1 and the first circuit block 201 and the second pin group PG2 and the second circuit block 202 may be disposed on a single silicon substrate. In some example embodiments, the first pin group PG1 and the first circuit block 201 and the second pin group PG2 and the second circuit block 202 are shifted, and/or mirrored relationship.

Figure 5:
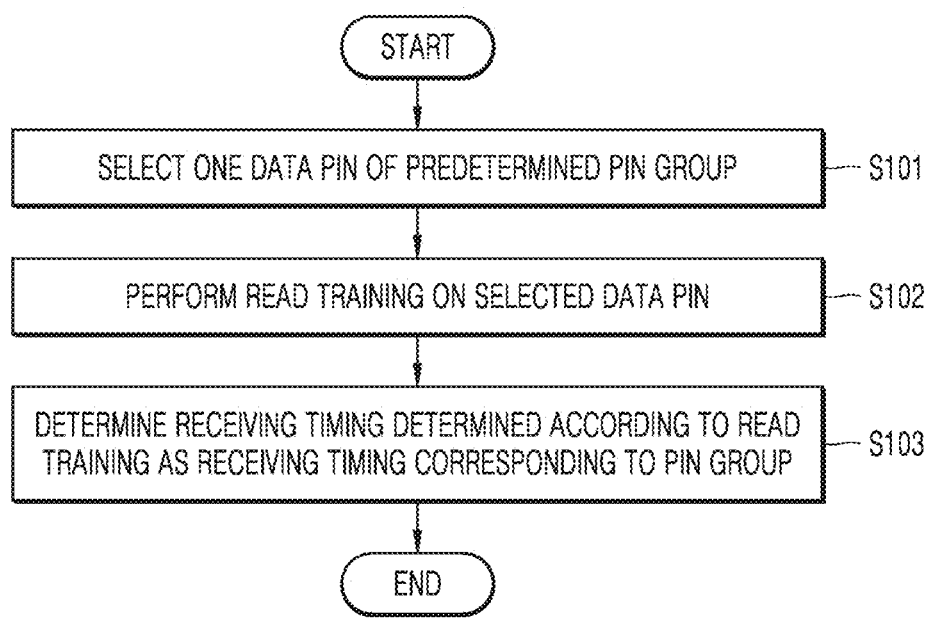
FIG. 5 is a flowchart illustrating an example of a read training operation of the memory controller of FIG. 3.

FIG. 5 is a flowchart illustrating an example of a read training operation of the memory controller of FIG. 3. Referring to FIGS. 3 and 5, in operation S101, the memory controller 100 may select one data pin from a specific (or, predetermined) pin group. For example, the memory controller 100 may select a first data pin D_P1 from the first pin group PG1 and select a third data pin D_P3 from the second pin group PG2.

In operation S102, the memory controller 100 may perform read training on the selected data pin. The memory controller 100 may perform read training to determine a receiving timing of a data signal received from the memory device 200 through the selected data pin. For example, the memory controller 100 may determine the receiving timing of the first data signal DQ1 as the first receiving timing RT1 by performing read training on the first data pin D_P1.

In operation S103, the memory controller 100 may determine the receiving timing determined according to the read training as the receiving timing corresponding to the pin group. The memory controller 100 may store the determined receiving timing corresponding to the pin group. For example, the memory controller 100 may determine a first receiving timing RT1 determined according to read training on the first data pin D_P1 as a receiving timing corresponding to the first pin group PG1. The memory controller 100 may set the first receiving timing RT1 corresponding to the first pin group PG1.

Figure 6:
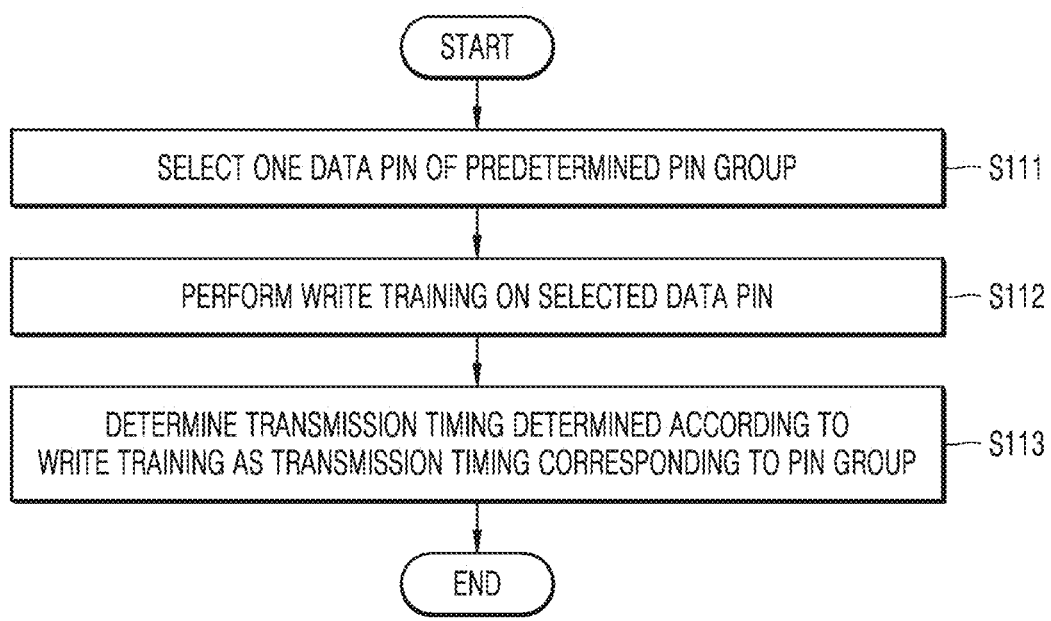
FIG. 6 is a flowchart illustrating an example of a write training operation of the memory controller of FIG. 3.

FIG. 6 is a flowchart illustrating an example of a write training operation of the memory controller of FIG. 3. Referring to FIGS. 3 and 6, in operation S111, the memory controller 100 may select one data pin from a specific (or, predetermined) pin group. For example, the memory controller 100 may select a first data pin D_P1 from the first pin group PG1 and select a third data pin D_P3 from the second pin group PG2; however, example embodiments are not limited thereto.

In operation S112, the memory controller 100 may perform write training on the selected data pin. The memory controller 100 may perform write training to determine a transmission timing of a data signal transmitted to the memory device 200 through the selected data pin. For example, the memory controller 100 may determine the transmission timing of the first data signal DQ1 as the first transmission timing TT1 by performing write training on the first data pin D_P1. In this case, write training may be performed so that a timing window between the write data strobe signal WDQS and the first data signal DQ1 is maximized.

In operation S113, the memory controller 100 may determine the transmission timing determined according to the write training as the transmission timing corresponding to the pin group. The memory controller 100 may store the determined transmission timing corresponding to the pin group. For example, the memory controller 100 may determine a first transmission timing TT1 determined according to write training on the first data pin D_P1 as a transmission timing corresponding to the first pin group PG1. The memory controller 100 may set the first transmission timing TT1 corresponding to the first pin group PG1.

In an example embodiment, unlike that shown in FIGS. 5 and 6, the memory controller 100 may perform training on each pin of one of the plurality of pin groups, and then determine a training value corresponding to the pin group based on training results for the pins. In an example embodiment, the training value determined corresponding to one pin group may be used to determine a training value for another pin group. In this case, training for each pin of another pin group may be omitted.

As described above, After read training is performed for each group on the data pins D_P, the memory controller 100 may sample each of the data signals received from the memory device 200 through one pin group at the same (e.g., substantially the same) time. In other words, sampling timing skew between sampling timing for the data signals may be minimized (or, reduced or removed). In this case, in order to optimize (or, improve) the data bit error rate of the sampled data signals, each of the data signals transmitted from the memory device 200 through one pin group should or must be transmitted to the memory controller 100 at the same time. In other words, the data skew between data signals inputted to the memory controller 100 should or must be minimized (or, reduced or removed).

As described above, after write training is performed for each group on the data pins D_P, the memory controller 100 may transmit each of the data signals corresponding to one pin group to the memory device 200 at the same time. In other words, the data skew between data signals outputted from the memory controller 100 may be minimized. In this case, memory device 200 may sample each of the data signals inputted to the memory device 200 at the same time. In other words, sampling timing skew between sampling timing for the data signals inputted to the memory device 200 may be minimized. Since each of the data signals is transmitted from the memory controller 100 at the same time, when each of the data signals inputted to the memory device 200 is sampled at the same time, the data bit error rate of the sampled data signals may be optimized.

In the following, in order to the data bit error rate of the data signals sampled by the memory controller 100 in read operation, the memory system 10 that minimizes data skew between the data signals inputted to the memory controller 100 through one pin group will be described in detail. And, in order to the data bit error rate of the data signals sampled by the memory device 200 in write operation, the memory system 10 that minimizes sampling timing skew between sampling timing for the data signals inputted to the memory device 200 through one pin group will be described in detail.

Figure 7:
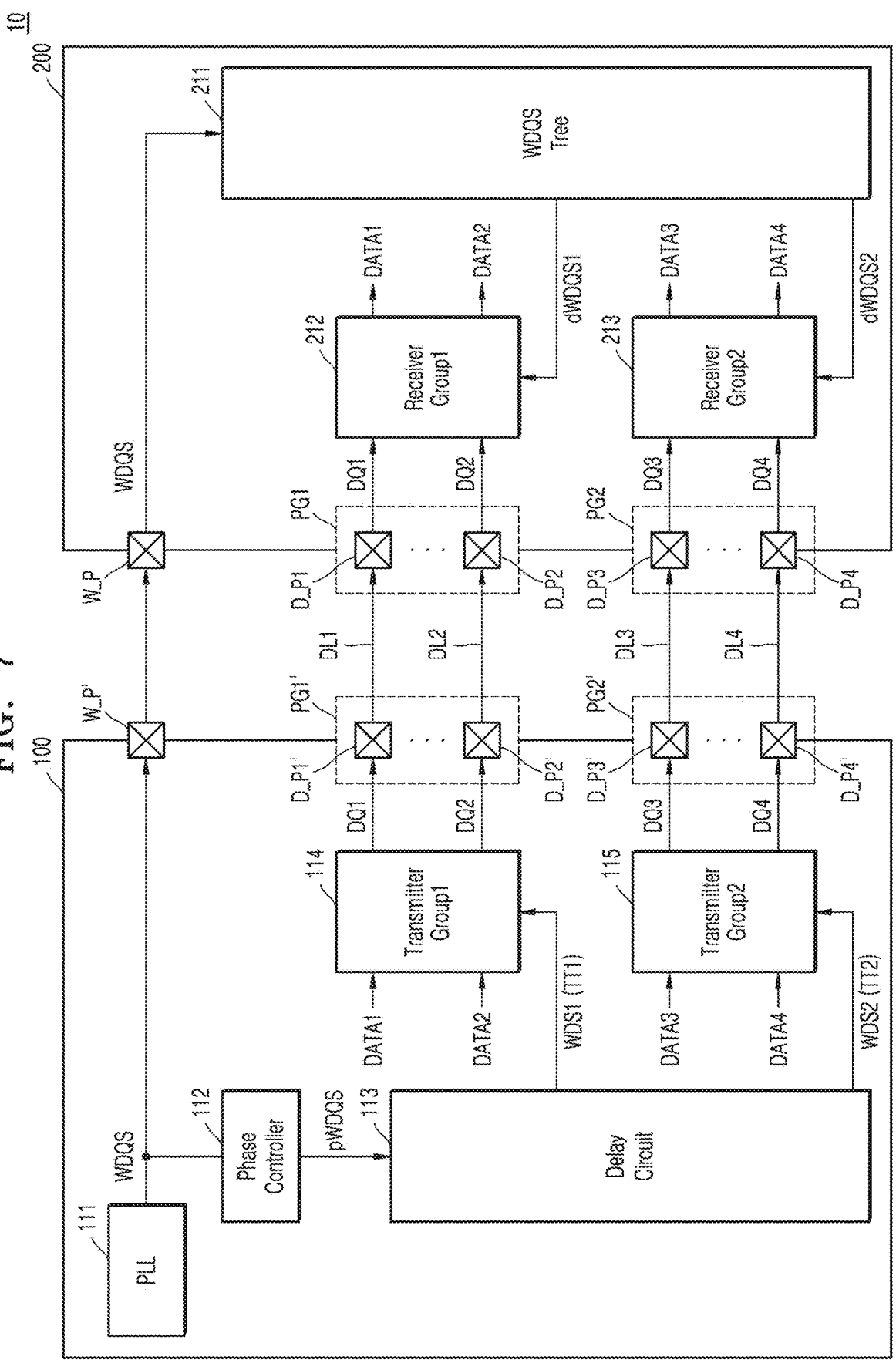
FIG. 7 is a block diagram schematically illustrating the memory system of FIG. 3 according to an example embodiment.

FIG. 7 is a block diagram schematically illustrating the memory system of FIG. 3. For convenience of explanation, configurations of the memory system 10 for performing a write operation according to the write training result (i.e., first and second transmission timing TT1 and TT2) described with reference to FIG. 3 are described, but example embodiments are not limited thereto.

Referring to FIG. 7, the memory controller 100 may include a write data strobe pin W_P', a first pin group PG1', and a second pin group PG2'. The write data strobe pin W_P', the first pin group PG1', and the second pin group PG2' may correspond to the write data strobe pin W_P, the first pin group PG1, and the second pin group PG2 of the memory device 200. The memory controller 100 may include a phase locked loop 111, a phase controller 112, a delay circuit 113, a first transmitter group 114, and a second transmitter group 115. For example, the phase locked loop 111, the phase controller 112, the delay circuit 113, the first transmitter group 114, and the second transmitter group 115 may be included in the host interface circuit 110 of FIG. 1.

The phase locked loop 111 may generate a write data strobe signal WDQS that toggles with a specific (or, predetermined) phase. The write data strobe signal WDQS may be provided to the phase controller 112 and may be transmitted to the memory device 200 through the write data strobe pin W_P'. In an example embodiment, although not shown in FIG. 7, the write data strobe signal WDQS may be transmitted to the memory device 200 through a separate transmitter (or buffer) positioned between the phase locked loop 111 and the write data strobe pin W_P'.

The phase controller 112 may generate a write data strobe signal pWDQS whose phase is adjusted by adjusting a phase of the write data strobe signal WDQS. For example, the phase controller 112 may adjust the phase of the write data strobe signal WDQS so that the phase difference between the write data strobe signal WDQS and the phase-adjusted write data strobe signal pWDQS is 90 degrees.

The delay circuit 113 may delay the write data strobe signal pWDQS whose phase is adjusted according to the write training result. The delay circuit 113 may delay the write data strobe signal pWDQS whose phase is adjusted according to the first transmission timing TT1 corresponding to the first pin group PG1 to generate the first write delay signal WDS1. The delay circuit 113 may delay the write data strobe signal pWDQS whose phase is adjusted according to the second transmission timing TT2 corresponding to the second pin group PG2 to generate the second write delay signal WDS2. The first write delay signal WDS1 may be provided to the first transmitter group 114, and the second write delay signal WDS2 may be provided to the second transmitter group 115. In this case, the first write delay signal WDS1 may have a toggle timing corresponding to the first transmission timing TT1, and the second write delay signal WDS2 may have a toggle timing corresponding to the second transmission timing TT2.

The first transmitter group 114 may transmit data signals including data to the memory device 200 through the first pin group PG1' based on the toggle timing of the first write delay signal WDS1. For example, the first transmitter group 114 may transmit the first data signal DQ1 including the first data DATA1 to the memory device 200 through the first data pin D_P1' based on the toggle timing of the first write delay signal WDS1. The first transmitter group 114 may transmit the second data signal DQ2 including the second data DATA2 to the memory device 200 through the second data pin D_P2' based on the toggle timing of the first write delay signal WDS1. Accordingly, the first transmitter group 114 may transmit each of the data signals to the memory device 200 at the same transmission timing (i.e., the first transmission timing TT1).

The second transmitter group 115 may transmit data signals including data to the memory device 200 through the second pin group PG2' based on the toggle timing of the second write delay signal WDS2. For example, the second transmitter group 115 may transmit the third data signal DQ3 including the third data DATA3 to the memory device 200 through the third data pin D_P3' based on the toggle timing of the second write delay signal WDS2. The second transmitter group 115 may transmit the fourth data signal DQ4 including the fourth data DATA4 to the memory device 200 through the fourth data pin D_P4' based on the toggle timing of the second write delay signal WDS2. Accordingly, the second transmitter group 115 may transmit each of the data signals to the memory device 200 at the same transmission timing (i.e., the second transmission timing TT2).

Data signals outputted through the first pin group PG1' may be transmitted to the first pin group PG1 through corresponding signal lines. In this case, signal lines may be configured to maintain minimized data skew between data signals transmitted to the first pin group PG1. For example, lengths and/or resistances of signal lines connecting the data pins of the first pin group PG1' and the data pins of the first pin group PG1 may be the same or substantially the same. As described above, since the data skew between the data signals outputted through the first pin group PG1' can be minimized, when the lengths of signal lines through which data signals are transmitted are the same (assuming that the physical properties of the signal lines are also the same), minimized data skew between data signals may be maintained until data signals reach the first pin group PG1. For example, when the length of the first signal line DL1 through which the first data signal DQ1 is transmitted and the length of the second signal line DL2 through which the second data signal DQ2 is transmitted are the same, data skew between the first and second data signals DQ1 and DQ2 inputted to the memory device 200 through the first and second data pins D_P1 and D_P2 may be kept minimized. Accordingly, each of the data signals transmitted from the first transmitter group 114 may be inputted to the memory device 200 at the same time.

Likewise, signal lines may be configured to maintain minimized data skew between data signals transmitted to the second pin group PG2. For example, lengths and/or resistances of signal lines connecting the data pins of the second pin group PG2' and the data pins of the second pin group PG2 may be the same. For example, when the length of the third signal line DL3 through which the third data signal DQ3 is transmitted and the length of the fourth signal line DL4 through which the fourth data signal DQ4 is transmitted are the same, data skew between the third and fourth data signals DQ3 and DQ4 received by the memory device 200 through the third and fourth data pins D_P3 and D_P4 may be minimized. Accordingly, each of the data signals transmitted from the second transmitter group 115 may be inputted to the memory device 200 at the same time.

The memory device 200 may include a write data strobe signal (WDQS) tree 211, a first receiver group 212, and a second receiver group 213. For example, the write data strobe signal (WDQS) tree 211, the first receiver group 212, and the second receiver group 213 may be included in the memory interface circuit 210 of FIG. 1. For example, the write data strobe signal (WDQS) tree 211, the first receiver group 212, and the second receiver group 213 may correspond to the first circuit block 201 and the second circuit block 202 of FIG. 4. The WDQS tree 211 may transmit to the first receiver group 212 the first internal write data strobe signal dWDQS1 toggling based on the write data strobe signal WDQS received through the write data strobe pin W_P and transmit the toggled second internal write data strobe signal dWDQS2 to the second receiver group 213. In an example embodiment, the WDQS tree 211 may include a plurality of repeaters, and may transmit the first internal write data strobe signal dWDQS1 and the second internal write data strobe signal dWDQS2 through the repeaters.

In an example embodiment, the first internal write data strobe signal dWDQS1 and the second internal write data strobe signal dWDQS2 may be/correspond to signals generated by delaying the write data strobe signal WDQS through the WDQS tree 211. In this case, toggle timing of the write data strobe signal WDQS and the first internal write data strobe signal dWDQS1 may be different from each other, and toggle timing of the write data strobe signal WDQS and the second internal write data strobe signal dWDQS2 may be different from each other. The toggle timing skew between the write data strobe signal WDQS and internal write data strobe signal (e.g. dWDQS1 or dWDQS2) may be generated by the WDQS tree 211. In this case, the transmission timing determined through training in the memory controller 100 may compensate for the toggle timing skew by the WDQS tree 211. Accordingly, a skew between the write data strobe signal WDQS and the first internal write data strobe signal dWDQS1 may be compensated by the first transmission timing TT1, and a skew between the write data strobe signal WDQS and the second internal write data strobe signal dWDQS2 may be compensated by the second transmission timing TT2.

FIG. 7 illustrates an example in which the first and second internal write data strobe signals dWDQS1 and dWDQS2 are generated by delaying the write data strobe signal WDQS through the WDQS tree 211, but example embodiments are limited thereto. In some example embodiments, the first internal write data strobe signal dWDQS1 and the second internal write data strobe signal dWDQS2 may be signals generated by delaying the divided write data strobe signal through the WDQS tree 211. In this case, a write data strobe signal divided from the write data strobe signal WDQS may be generated through a divider located between the write data strobe pin W_P and the WDQS tree 211.

The first receiver group 212 may sample each of the data signals received through the first pin group PG1 based on the toggle timing of the first internal write data strobe signal dWDQS1. Accordingly, the first receiver group 212 may obtain data from data signals received through the first pin group PG1. For example, the first receiver group 212 may sample the first data signal DQ1 received through the first data pin D_P1 to obtain the first data DATA1 based on the toggle timing of the first internal write data strobe signal dWDQS1 and obtain the second data DATA2 by sampling the second data signal DQ2 received through the second data pin D_P2.

The second receiver group 213 may sample each of the data signals received through the second pin group PG2 based on the toggle timing of the second internal write data strobe signal dWDQS2. Accordingly, the second receiver group 213 may obtain data from data signals received through the second pin group PG2. For example, the second receiver group 213 may obtain the third data DATA3 by sampling the third data signal DQ3 received through the third data pin D_P3 based on the toggle timing of the second internal write data strobe signal dWDQS2 and obtain the fourth data DATA4 by sampling the fourth data signal DQ4 received through the fourth data pin D_P4.

In such a manner, when each of the data signals received through one pin group is sampled based on the same toggle timing (e.g., the toggle timing of the first internal write data strobe signal dWDQS1 or the toggle timing of the second internal write data strobe signal dWDQS2), sampling timing skew for data signals can be minimized.

As described above, in relation to the memory system 10 according to some example embodiments of inventive concepts, the memory controller 100 may transmit each of the data signals to the memory device 200 through one pin group at the same transmission time. The memory device 200 may sample each of the data signals inputted through one pin group at the same sampling time. Accordingly, even if the write training is performed for each pin group, the data bit error rate of data signals transmitted from the memory controller 100 to the memory device 200 in the write operation can be optimized.

Figure 8:
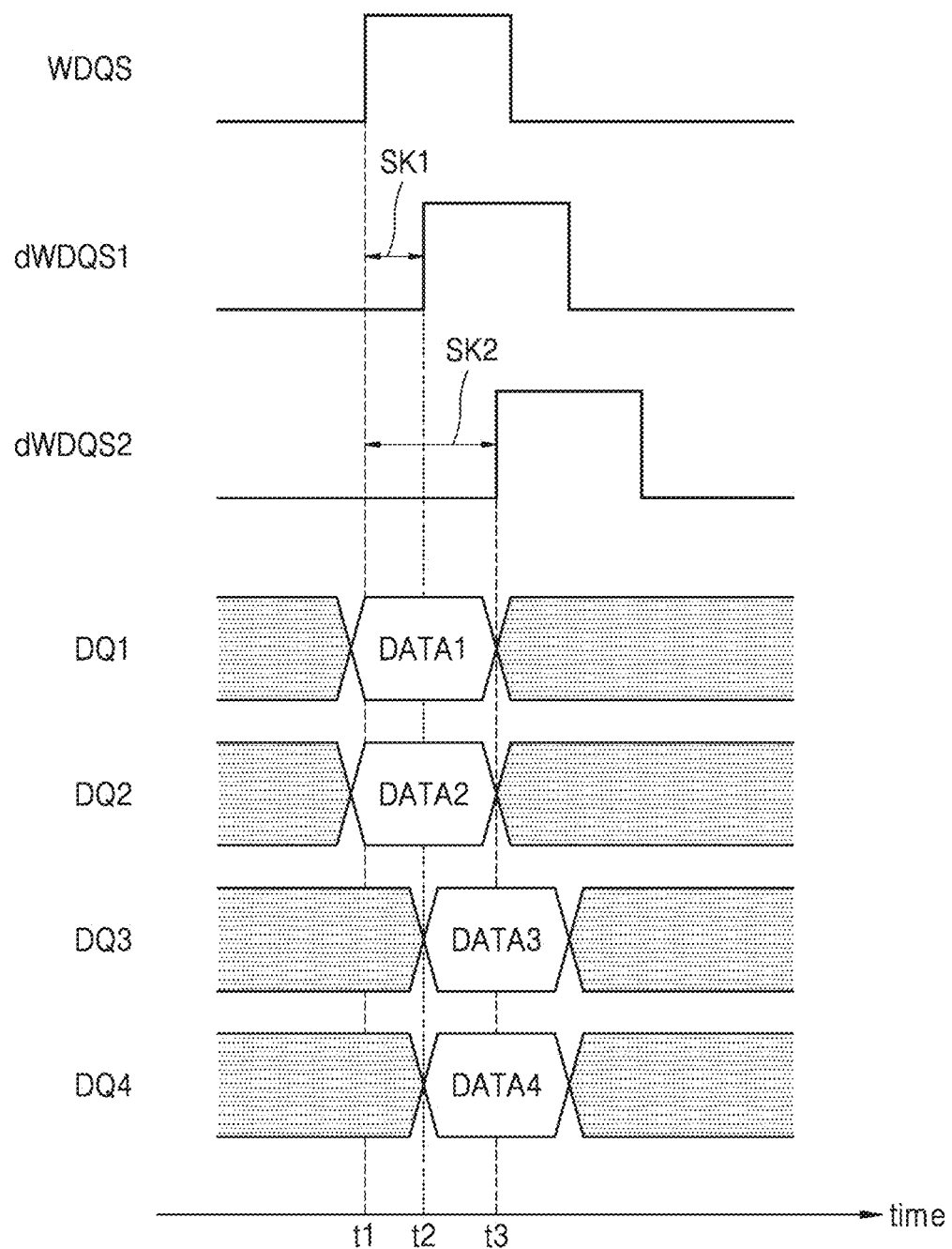
FIG. 8 is a timing diagram illustrating an example in which the memory device of FIG. 7 samples data signals.

FIG. 8 is a timing diagram illustrating an example in which the memory device of FIG. 7 samples data signals. Referring to FIGS. 7 and 8, a write data strobe signal WDQS received by the memory device 200 through a write data strobe pin W_P may have a toggle timing at a first time point t1. The first internal write data strobe signal dWDQS1 transmitted to the first receiver group 212 by the WDQS tree 211 has a toggle timing at the second time point t2, and the second internal write data strobe signal dWDQS2 transmitted to the second receiver group 213 by the WDQS tree 211 may have a toggle timing at a third time point t3. Accordingly, a first skew SK1 between the first internal write data strobe signal dWDQS1 and the write data strobe signal WDQS may be generated, and a second skew SK2 between the second internal write data strobe signal dWDQS2 and the write data strobe signal WDQS may be generated. For example, the first skew SK1 is different from the second skew SK2.

The first data signal DQ1 including the first data DATA1 and the second data signal DQ2 including the second data DATA2 may be transmitted to the first receiver group 212 according to the first transmission timing TT1 for compensating for the first skew SK1. The first data signal DQ1 and the second data signal DQ2 transmitted to the first receiver group 212 may be sampled based on the toggle timing of the first internal write data strobe signal dWDQS1. In this case, a sampling margin for the first data DATA1 and the second data DATA2 is secured (or, improved), so that a data bit error rate can be optimized.

The third data signal DQ3 including the third data DATA3 and the fourth data signal DQ4 including the fourth data DATA4 may be transmitted to the second receiver group 213 according to the second transmission timing TT2 for compensating for the second skew SK2. The third data signal DQ3 and the fourth data signal DQ4 delivered to the second receiver group 213 may be sampled based on the toggle timing of the second internal write data strobe signal dWDQS2. In this case, a sampling margin for the third data DATA3 and the fourth data DATA4 is secured (or, improved), so that the data bit error rate can be optimized.

As described above, the sampling timing skew for data signals transmitted through one pin group of the memory device 200 may be minimized. For example, the sampling timing for the first data signal DQ1 and the sampling timing for the second data signal DQ2 are the same. Hereinafter, a detailed configuration of a memory device for minimizing sampling timing skew for data signals transmitted through one pin group will be described with reference to FIG. 9.

Figure 9:
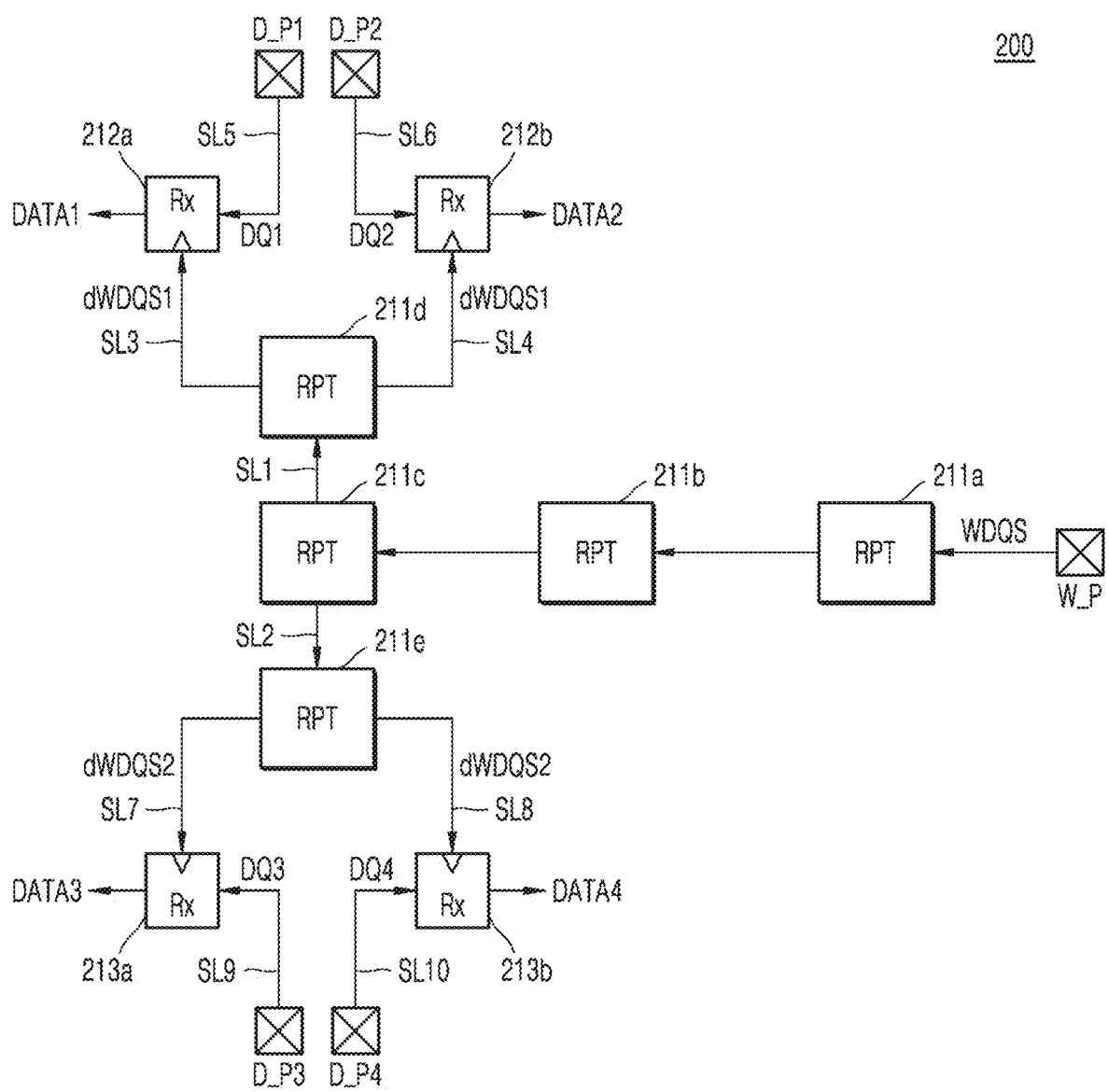
FIG. 9 is a diagram illustrating an example configuration of the memory device of FIG. 7.

FIG. 9 is a diagram illustrating an example configuration of the memory device of FIG. 7. Referring to FIGS. 7 and 9, the memory device 200 may include a plurality of repeaters 211a to 211e and a plurality of receivers 212a, 212b, 213a, and 213b. The repeaters 211a to 211e may be included in the WDQS tree 211. The receivers 212a and 212b may be included in the first receiver group 212, and the receivers 213a and 213b may be included in the second receiver group 213.

The write data strobe signal WDQS received through the write data strobe pin W_P may be transmitted to the receivers 212a and 212b, respectively, as the first internal write data strobe signal dWDQS1, through the repeaters 211a, 211b, 211c, and 211d on the first path. The write data strobe signal WDQS may be transmitted to the receivers 213a and 213b as a second internal write data strobe signal dWDQS2 through the repeaters 211a, 211b, 211c, and 211e on the second path. For example, when the length of and/or resistance of the first signal line SL1 connecting the repeater 211c and the repeater 211d on the first path is different from the length of/resistance of the second signal line SL2 connecting the repeater 211c and the repeater 211e on the second path, as described with reference to FIG. 8, the toggle timing of the first internal write data strobe signal dWDQS1 and the toggle timing of the second internal write data strobe signal dWDQS2 may be different. For example, each of the repeaters 211a to 211e may be implemented with at least one buffer or at least one inverter.

The receiver 212a may sample the first data signal DQ1 received through the first data pin D_P1 based on the toggle timing of the first internal write data strobe signal dWDQS1 and output the first data DATA1. The receiver 212b may sample the second data signal DQ2 received through the second data pin D_P2 based on the toggle timing of the first internal write data strobe signal dWDQS1 and output the second data DATA2. In some example embodiments, in order for the receivers 212a and 212b to sample the data signals DQ1 and DQ2 at the same toggle timing (i.e., in order for the first internal write data strobe signal dWDQS1 to reach the same timing with the receivers 212a and 212b), the receivers 212a and 212b may be disposed at the same distance from the repeater 211d. In some example embodiments, in order for the receivers 212a and 212b to sample the data signals DQ1 and DQ2 at the same toggle timing, the length of the third signal line SL3 for transmitting the first internal write data strobe signal dWDQS1 from the repeater 211d to the receiver 212a and the length of the fourth signal line SL4 for transmitting the first internal write data strobe signal dWDQS1 from the repeater 211d to the receiver 212b may be the same.

The receiver 212a may receive the first data signal DQ1 from the first data pin D_P1 through the fifth signal line SL5, and the receiver 212b may receive the second data signal DQ2 from the second data pin D_P2 through the sixth signal line SL6. In some example embodiments, in order for the data signals DQ1 and DQ2 to be transmitted from the first and second data pins D_P1 and D_P2 to the receivers 212a and 212b at the same timing, the length of the fifth signal line SL5 and the length of the sixth signal line SL6 may be the same.

The receiver 213a may sample the third data signal DQ3 received through the third data pin D_P3 based on the toggle timing of the second internal write data strobe signal dWDQS2 and output the third data DATA3. The receiver 213b may sample the fourth data signal DQ4 received through the fourth data pin D_P4 based on the toggle timing of the second internal write data strobe signal dWDQS2 and output the fourth data DATA4. In some example embodiments, in order for the receivers 213a and 213b to sample the data signals DQ3 and DQ4 at the same toggle timing (e.g., in order for the second internal write data strobe signal dWDQS2 to reach the same timing with the receivers 213a and 213b), the receivers 213a and 213b may be arranged to have the same distance from the repeater 211e. As an example, the length of the seventh signal line SL7 for transmitting the second internal write data strobe signal dWDQS2 from the repeater 211e to the receiver 213a and the length of the eighth signal line SL8 for transmitting the second internal write data strobe signal dWDQS2 from the repeater 211e to the receiver 213b may be the same.

The receiver 213a may receive the third data signal DQ3 from the third data pin D_P3 through the ninth signal line SL9, and the receiver 213b may receive the fourth data signal DQ4 from the fourth data pin D_P4 through the tenth signal line SL10. In an example embodiment, in order for the data signals DQ3 and DQ4 to be transmitted from the third and fourth data pins D_P3 and D_P4 to the receivers 213a and 213b at the same timing, the length of the ninth signal line SL9 and the length of the tenth signal line SL10 may be the same.

When the memory device 200 is configured as described above, the internal write data strobe signal may be transmitted to each of the receivers corresponding to one pin group at the same time. Accordingly, the sampling timing skew for data signals received through one pin group can be minimized. For example, the sampling timing skew may be compensated by adding dummy loads such as regulating length and/or resistance of signal lines.

Figure 10:
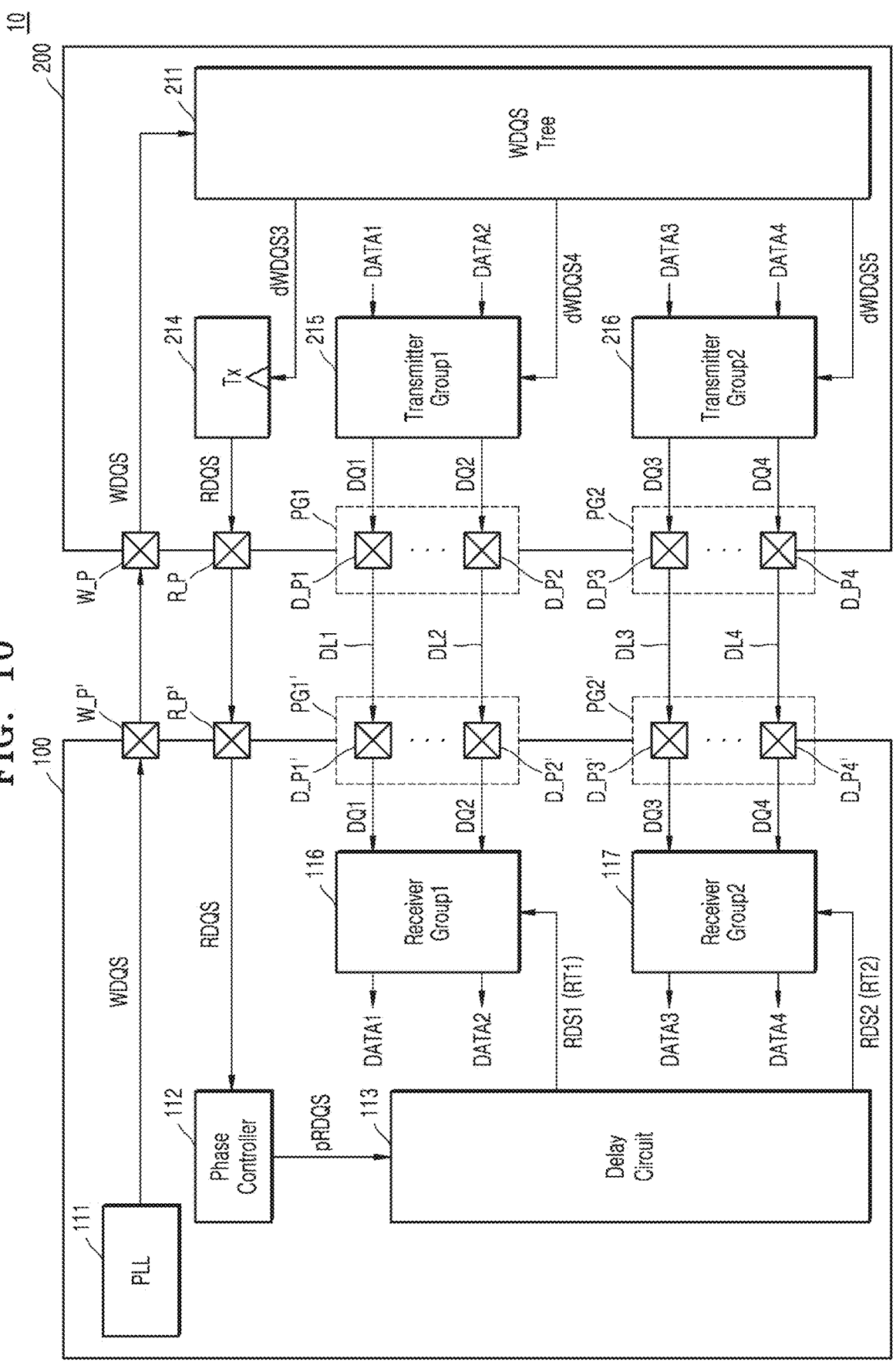
FIG. 10 is a block diagram schematically illustrating the memory system of FIG. 3 according to an example embodiment.

FIG. 10 is a block diagram schematically illustrating the memory system of FIG. 3. For convenience of explanation, configurations of the memory system 10 for performing a read operation according to the read training result (e.g., first and second receiving timing RT1 and RT2) described with reference to FIG. 3 are described, but the example embodiment is not limited thereto.

Referring to FIG. 10, the memory controller 100 may include a write data strobe pin W_P', a read data strobe pin R_P', a first pin group PG1', and a second pin group PG2'. The write data strobe pin W_P', the read data strobe pin R_P', the first pin group PG1', and the second pin group PG2' may correspond to the write data strobe pin W_P, the read data strobe pin R_P, the first pin group PG1, and the second pin group PG2 of the memory device 200.

The memory device 200 may include a WDQS tree 211, a transmitter 214, a first transmitter group 215, and a second transmitter group 216. For example, WDQS tree 211, a transmitter 214, a first transmitter group 215, and a second transmitter group 216 may be included in the host interface circuit 210 of FIG. 1. The WDQS tree 211 may transmit to the transmitter 214 a third internal write data strobe signal dWDQS3 toggling based on the write data strobe signal WDQS received through the write data strobe pin W_P. The WDQS tree 211 may transmit the fourth internal write data strobe signal dWDQS4 toggling based on the write data strobe signal WDQS to the first transmitter group 215, and transmit the toggled fifth internal write data strobe signal dWDQS5 to the second transmitter group 216. For example, the toggle timing of the fourth internal write data strobe signal dWDQS4 may be the same as the toggle timing of the first internal write data strobe signal dWDQS1 of FIG. 7, and the toggle timing of the fifth internal write data strobe signal dWDQS5 may be the same as the second internal write data strobe signal dWDQS2 of FIG. 7. In some example embodiments, the WDQS tree 211 may include a plurality of repeaters, and may transmit the third to fifth internal write data strobe signals dWDQS3 to dWDQS5 through the repeaters.

The transmitter 214 may transmit the read data strobe signal RDQS to the memory controller 100 through the read data strobe pin R_P based on the toggle timing of the third internal write data strobe signal dWDQS3.

In some example embodiments, the third to fifth internal write data strobe signals dWDQS3 to dWDQS5 may be signals generated by delaying the write data strobe signal WDQS through the WDQS tree 211. In this case, toggle timing of the read data strobe signal RDQS generated based on the third internal write data strobe signal dWDQS3 and the fourth internal write data strobe signal dWDQS4 may be different from each other, and toggle timing of the read data strobe signal RDQS and the fifth internal write data strobe signal dWDQS5 may be different from each other. Accordingly, the toggle timing skew may be generated by the WDQS tree 211. The receiving timing determined through training in the memory controller 100 may compensate for the toggle timing skew by the WDQS tree 211. Accordingly, a skew between the read data strobe signal RDQS and the fourth internal write data strobe signal dWDQS4 may be compensated by the first receiving timing RT1, and a skew between the read data strobe signal RDQS and the fifth internal write data strobe signal dWDQS5 may be compensated by the second receiving timing RT2.

The first transmitter group 215 may transmit data signals including data to the memory controller 100 through the first pin group PG1 based on the toggle timing of the fourth internal write data strobe signal dWDQS4. For example, the first transmitter group 215 may transmit the first data signal DQ1 including the first data DATA1 to the memory controller 100 through the first data pin D_P1 based on the toggle timing of the fourth internal write data strobe signal dWDQS4. The first transmitter group 215 may transmit the second data signal DQ2 including the second data DATA2 to the memory controller 100 through the second data pin D_P2 based on the toggle timing of the fourth internal write data strobe signal dWDQS4. Accordingly, the first transmitter group 215 may transmit each of the data signals to the memory controller 100 at the same time.

The second transmitter group 216 may transmit data signals including data to the memory controller 100 through the second pin group PG2 based on the toggle timing of the fifth internal write data strobe signal dWDQS5. For example, the second transmitter group 216 may transmit the third data signal DQ3 including the third data DATA3 to the memory controller 100 through the third data pin D_P3 based on the toggle timing of the fifth internal write data strobe signal dWDQS5. The second transmitter group 216 may transmit the fourth data signal DQ4 including the fourth data DATA4 to the memory controller 100 through the fourth data pin D_P4 based on the toggle timing of the fifth internal write data strobe signal dWDQS5. Accordingly, the second transmitter group 216 may transmit each of the data signals to the memory controller 100 at the same time.

In this way, when each of the data signals is outputted at the same timing through one pin group, the data skew between the output data signals can be minimized.

As described with reference to FIG. 7, the lengths of signal lines connecting the first pin group PG1' and the first pin group PG1 may be the same, and the lengths of signal lines connecting the second pin group PG2' and the second pin group PG2 may be the same. As described above, since data skew between data signals outputted through one pin group can be minimized, when the lengths of signal lines through which data signals are transmitted are the same, data skew may be kept minimized until data signals are transmitted to the memory controller 100. Accordingly, each of the data signals transmitted from the first transmitter group 215 may be inputted to the memory controller 100 at the same time, and each of the data signals transmitted from the second transmitter group 216 may be inputted to the memory controller 100 at the same time.

The memory controller 100 may include a phase locked loop 111, a phase controller 112, a delay circuit 113, a first receiver group 116, and a second receiver group 117. For example, the phase locked loop 111, the phase controller 112, the delay circuit 113, the first receiver group 116, and the second receiver group 117 may be included in the host interface circuit 110 of FIG. 1.

The phase locked loop 111 may generate a write data strobe signal WDQS that toggles with a predetermined phase. The write data strobe signal WDQS may be transmitted to the memory device 200 through the write data strobe pin W_P'.

The phase controller 112 may receive the read data strobe signal RDQS transmitted from the memory device 200 through the read data strobe pin R_P'. The phase controller 112 may generate a read data strobe signal pRDQS whose phase is adjusted by adjusting a phase of the read data strobe signal RDQS. For example, the phase controller 112 may adjust the phase of the read data strobe signal RDQS so that a phase difference between the read data strobe signal RDQS and the phase adjusted read data strobe signal pRDQS is 90 degrees.

The delay circuit 113 may delay the read data strobe signal pRDQS whose phase is adjusted according to the read training result. The delay circuit 113 delays the read data strobe signal pRDQS whose phase is adjusted according to the first receiving timing RT1 corresponding to the first pin group PG1 to generate the first read delay signal RDS1. The delay circuit 113 delays the read data strobe signal pRDQS whose phase is adjusted according to the second receiving timing RT2 corresponding to the second pin group PG2 to generate the second read delay signal RDS2. The first read delay signal RDS1 may be provided to the first receiver group 116, and the second read delay signal RDS2 may be provided to the second receiver group 117. In this case, the first read delay signal RDS1 may have a toggle timing corresponding to the first receiving timing RT1, and the second read delay signal RDS2 may have a toggle timing corresponding to the second receiving timing RT2.

The first receiver group 116 may obtain data by sampling each of the data signals received through the first pin group PG1' based on the toggle timing of the first read delay signal RDS1. For example, the first receiver group 116 may obtain the first data DATA1 by sampling the first data signal DQ1 based on the toggle timing of the first read delay signal RDS1. The first receiver group 116 may obtain the second data DATA2 by sampling the second data signal DQ2 based on the toggle timing of the first read delay signal RDS1. Accordingly, the first receiver group 116 may sample each of the data signals according to the same receiving timing (e.g., the first receiving timing RT1).

The second receiver group 117 may obtain data by sampling each of the data signals received through the second pin group PG2' based on the toggle timing of the second read delay signal RDS2. For example, the second receiver group 117 may obtain the third data DATA3 by sampling the third data signal DQ3 based on the toggle timing of the second read delay signal RDS2. The second receiver group 117 may obtain the fourth data DATA4 by sampling the fourth data signal DQ4 based on the toggle timing of the second read delay signal RDS2. Accordingly, the second receiver group 117 may sample each of the data signals according to the same receiving timing (e.g., the second receiving timing RT2).

As described above, in relation to the memory system 10 according to some example embodiments of inventive concepts, the memory device 200 may transmit each of the data signals to the memory controller 100 through one pin group at the same time. The memory controller 100 may sample each of the data signals received through one pin group at the same time. Accordingly, even if the read training is performed for each pin group, a data bit error rate of data signals transmitted from the memory device 200 to the memory controller 100 in the read operation may be optimized.

Figure 11:
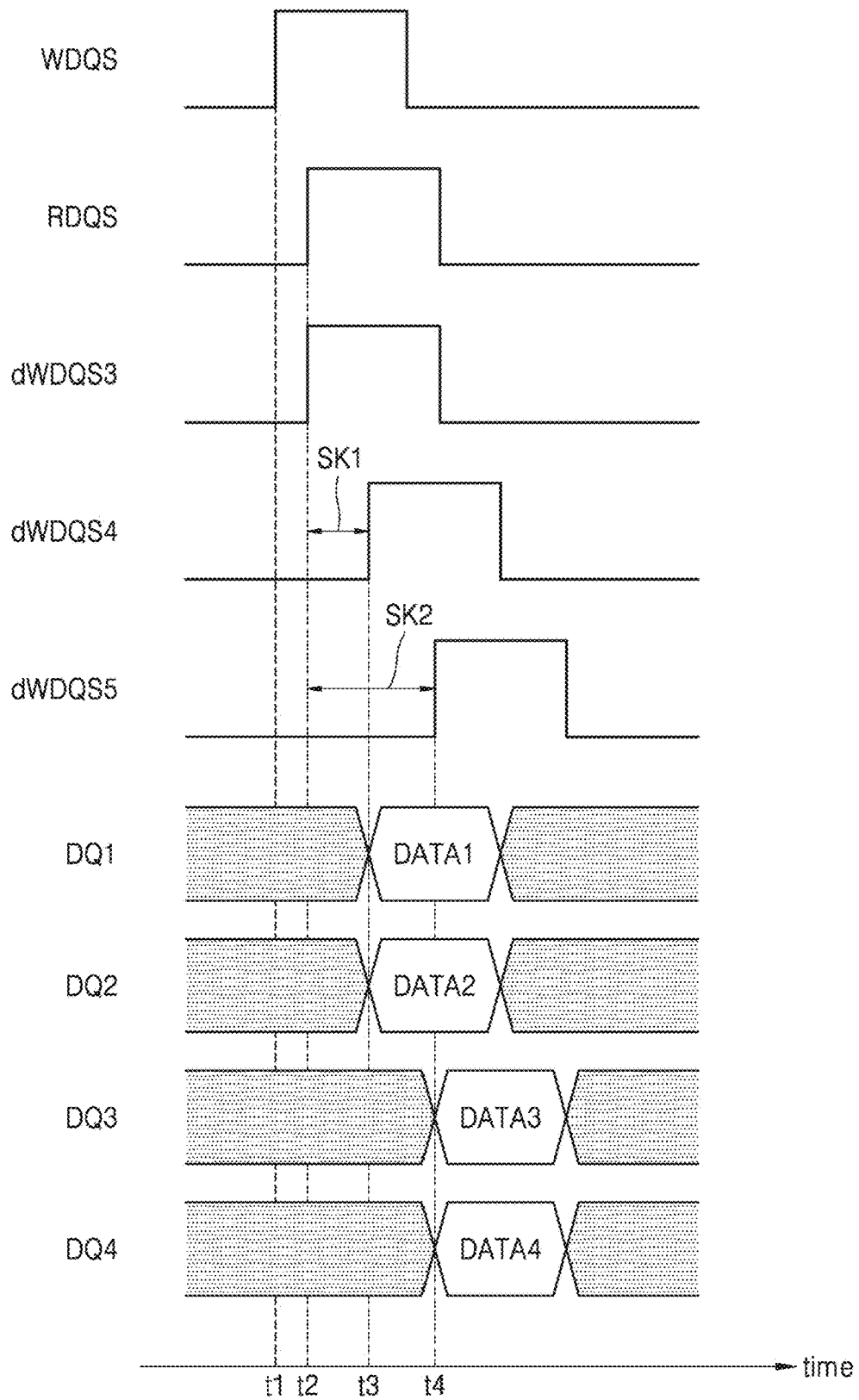
FIG. 11 is a timing diagram illustrating an example in which the memory device of FIG. 10 transmits data signals.

FIG. 11 is a timing diagram illustrating an example in which the memory device of FIG. 10 transmits data signals. Referring to FIGS. 10 and 11, a write data strobe signal WDQS received through a write data strobe pin W_P may have a toggle timing at a first time point t1. The third internal write data strobe signal dWDQS3 transmitted to the transmitter 214 by the WDQS tree 211 and the read data strobe signal RDQS may have a toggle timing at the second time point t2. The fourth internal write data strobe signal dWDQS4 transmitted to the first transmitter group 215 may have a toggle timing at a third time point t3, and the fifth internal write data strobe signal dWDQS5 transmitted to the second transmitter group 216 by the WDQS tree 211 may have a toggle timing at a fourth time point t4. Accordingly, a first skew SK1 between the fourth internal write data strobe signal dWDQS4 and the read data strobe signal RDQS may be generated, and a second skew SK2 between the fifth internal write data strobe signal dWDQS5 and the read data strobe signal RDQS may be generated.

The first data signal DQ1 including the first data DATA1 and the second data signal DQ2 including the second data DATA2 may be transmitted to the memory controller 100 at a toggle timing of the fourth internal write data strobe signal dWDQS4. Accordingly, the first data DATA1 and the second data DATA2 may be transmitted to the memory controller 100 at the same timing. The first data signal DQ1 and the second data signal DQ2 transmitted to the first receiver group 116 may be sampled based on a first receiving timing RT1 for compensating for the first skew SK1. In this case, a sampling margin for the first data DATA1 and the second data DATA2 is secured, so that the data bit error rate can be optimized.

The third data signal DQ3 including the third data DATA3 and the fourth data signal DQ4 including the fourth data DATA4 may be transmitted to the memory controller 100 at a toggle timing of the fifth internal write data strobe signal dWDQS5. Accordingly, the third data DATA3 and the fourth data DATA4 may be transmitted to the memory controller 100 at the same timing. The third data signal DQ3 and the fourth data signal DQ4 transmitted to the second receiver group 117 may be sampled based on the second receiving timing RT2 for compensating for the second skew SK2. In this case, a sampling margin for the third data DATA3 and the fourth data DATA4 is secured, so that the data bit error rate can be optimized.

As described above, data skew between data signals outputted from one pin group of the memory device 200 may be minimized. For example, the first data DATA1 and the second data DATA2 are transmitted at the same time (e.g. the fourth time point t4). Hereinafter, a detailed configuration of a memory device that minimizes data skew between data signals outputted from one pin group will be described with reference to FIG. 12.

Figure 12:
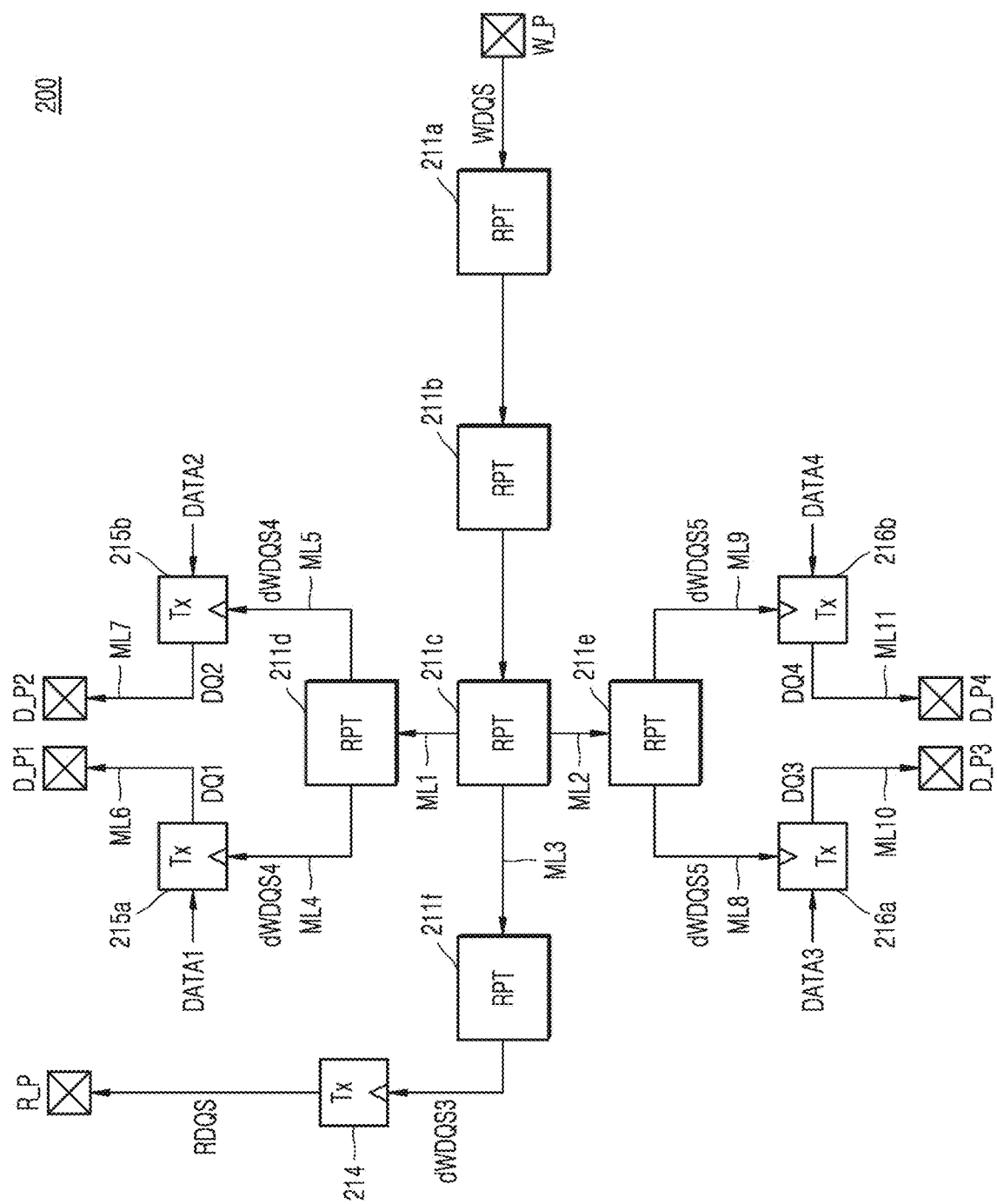
FIG. 12 is a diagram illustrating an example configuration of the memory device of FIG. 10.

FIG. 12 is a diagram illustrating an example configuration of the memory device of FIG. 10. Referring to FIGS. 10 and 12, the memory device 200 may include a plurality of repeaters 211a to 211f and a plurality of transmitters 214, 215a, 215b, 216a and 216b. The repeaters 211a to 211f may be included in the WDQS tree 211. The transmitters 215a and 215b may be included in the first transmitter group 215, and the transmitters 216a and 216b may be included in the second transmitter group 216.

The write data strobe signal WDQS received through the write data strobe pin W_P may be transmitted to the transmitters 215a and 215b, respectively, as the fourth internal write data strobe signal dWDQS4 through the repeaters 211a, 211b, 211c, and 211d on the first path. The write data strobe signal WDQS may be transmitted to the transmitters 216a and 216b as a fifth internal write data strobe signal dWDQS5 through the repeaters 211a, 211b, 211c, and 211e on the second path. The write data strobe signal WDQS may be transmitted to the transmitter 214 as a third internal write data strobe signal dWDQS3 through the repeaters 211a, 211b, 211c, and 211f on the third path. For example, when the length of the first signal line ML1 connecting the repeater 211c and the repeater 211d on the first path, the length of the second signal line ML2 connecting the repeater 211c and the repeater 211e on the second path, and the length of the third signal line ML3 connecting the repeater 211c and the repeater 211f on the third path are different from each other, as described with reference to FIG. 11, toggle timing of the third to fifth internal write data strobe signals dWDQS3 to dWDQS5 may be different from each other.

The transmitter 214 may generate the read data strobe signal RDQS based on the toggle timing of the third internal write data strobe signal dWDQS3. The transmitter 215a may transmit the first data signal DQ1 including the first data DATA1 to the memory controller 100 through the first data pin D_P1 based on the toggle timing of the fourth internal write data strobe signal dWDQS4. The transmitter 215b may transmit the second data signal DQ2 including the second data DATA2 to the memory controller 100 through the second data pin D_P2 based on the toggle timing of the fourth internal write data strobe signal dWDQS4.

In an example embodiment, in order for the transmitters 215a and 215b to transmit the data signals DQ1 and DQ2 at the same toggle timing (i.e., in order for the fourth internal write data strobe signal dWDQS4 to reach the same timing with the transmitters 215a and 215b), the transmitters 215a and 215b may be disposed at the same distance from the repeater 211d. As an example, in order for the transmitters 215a and 215b to transmit the data signals DQ1 and DQ2 at the same toggle timing, the length of the fourth signal line ML4 for transmitting the fourth internal write data strobe signal dWDQS4 from the repeater 211d to the transmitter 215a, and the length of the fifth signal line ML5 for transmitting the fourth internal write data strobe signal dWDQS4 from the repeater 211d to the transmitter 215b may be the same.

The first data signal DQ1 may be outputted through the first data pin D_P1 connected to the sixth signal line ML6, and the second data signal DQ2 may be outputted through the second data pin D_P2 connected to the seventh signal line ML7. In an example embodiment, in order for the data signals DQ1 and DQ2 to be outputted from the data pins D_P1 and D_P2 at the same timing, the length of the sixth signal line ML6 and the length of the seventh signal line ML7 may be the same.

The transmitter 216a may transmit the third data signal DQ3 including the third data DATA3 to the memory controller 100 through the third data pin D_P3 based on the toggle timing of the fifth internal write data strobe signal dWDQS5. The transmitter 216b may transmit the fourth data signal DQ4 including the fourth data DATA4 to the memory controller 100 through the fourth data pin D_P4 based on the toggle timing of the fifth internal write data strobe signal dWDQS5.

In an example embodiment, in order for the transmitters 216a and 216b to transmit the data signals DQ3 and DQ4 at the same toggle timing (i.e., in order for the fifth internal write data strobe signal dWDQS5 to reach the same timing with the transmitters 216a and 216b), the transmitters 216a and 216b may be disposed at the same distance from the repeater 211e. As an example, in order for the transmitters 216a and 216a to transmit the data signals DQ3 and DQ4 at the same toggle timing, the length of the eighth signal line ML8 for transmitting the fifth internal write data strobe signal dWDQS5 from the repeater 211e to the transmitter 216a and the length of the ninth signal line ML9 for transmitting the fifth internal write data strobe signal dWDQS5 from the repeater 211e to the transmitter 216b may be the same.

The third data signal DQ3 may be outputted through the third data pin D_P3 connected to the tenth signal line ML10, and the fourth data signal DQ4 may be outputted through the fourth data pin D_P4 connected to the eleventh signal line ML11. In an example embodiment, in order for the data signals DQ3 and DQ4 to be outputted from the data pins D_P3 and D_P4 at the same timing, the length of the tenth signal line ML10 and the length of the eleventh signal line ML11 may be the same.

When the memory device 200 is configured as described above, toggle timing skew between internal write data strobe signals transmitted to transmitters corresponding to one pin group can be minimized. For example, toggle timing skew between the fourth internal write data strobe signal dWDQS4 to transmitter 215a and the fourth internal write data strobe signal dWDQS4 to transmitter 215b. And data skew between data signals outputted from transmitters through one pin group can be minimized.

Figure 13:
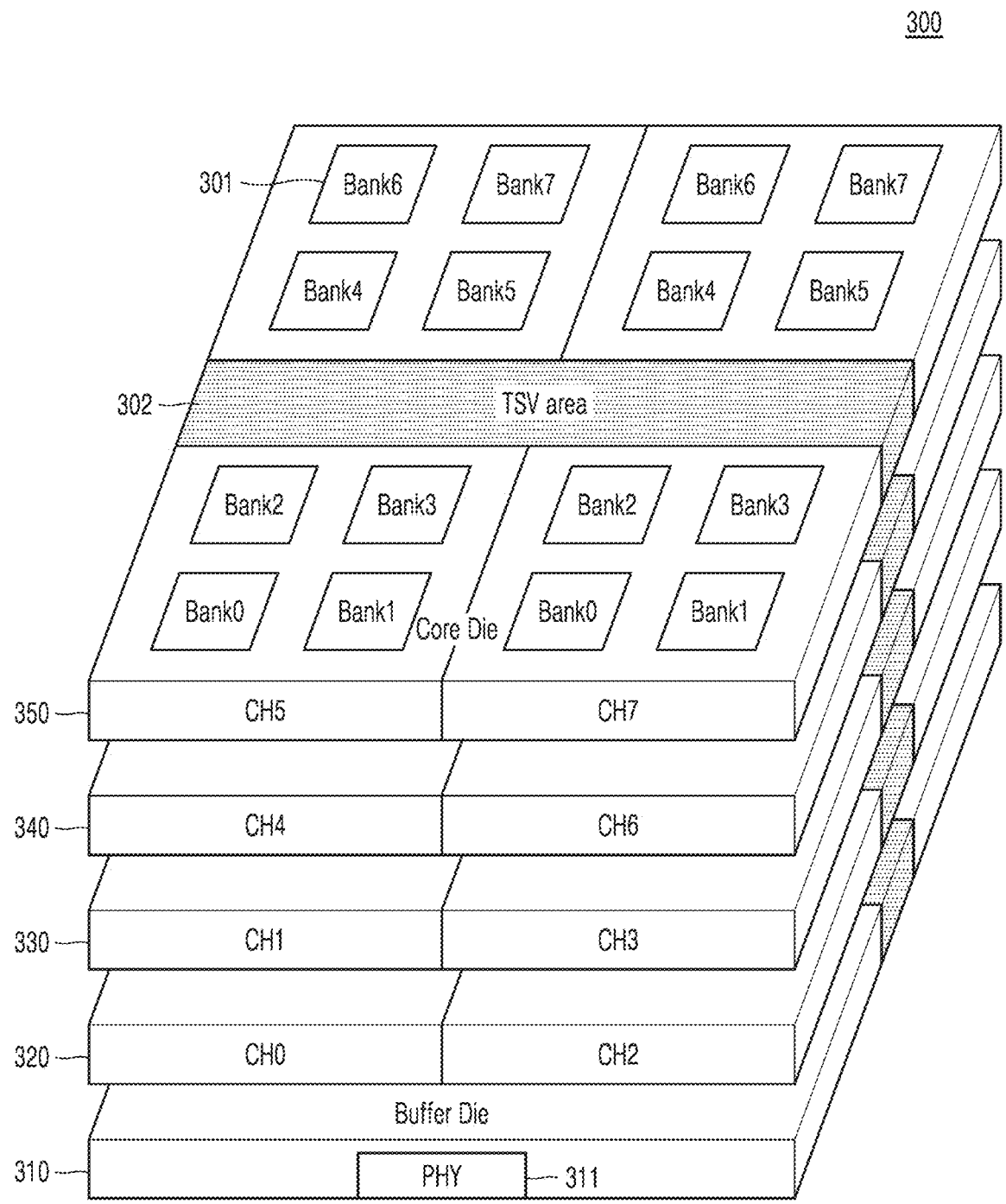
FIG. 13 is a block diagram showing a stacked memory device according to an example embodiment.

FIG. 13 is a block diagram illustrating a stacked memory device according to some example embodiments of inventive concepts. Referring to FIG. 13, a stacked memory device 300 may include a buffer die 310 and a plurality of core dies 320 to 350. For example, the buffer die 310 may also be referred to as an interface die, a base die, a logic die, a master die, and the like, and each of the core dies 320 to 350 may also be referred to as a memory die, a slave die, or the like. FIG. 13 shows that the four core dies 320 to 350 are included in the stacked memory device 300, but the number of core dies may vary. For example, the stacked memory device 300 may include 8, 12 or 16 core dies.

The buffer die 310 and the core dies 320 to 350 are stacked through a through silicon via (TSV) and may be electrically connected to each other. Accordingly, the stacked memory device 300 may have a three-dimensional memory structure in which the plurality of dies 310 to 350 are stacked. For example, the stacked memory device 300 may be implemented based on HBM or HMC standards, but the example embodiment is not limited thereto.

The stacked memory device 300 may support a plurality of functionally independent channels (or vaults). For example, as shown in FIG. 13, the stacked memory device 300 may support at least or exactly eight channels CH0 to CH7. When each of the channels CH0 to CH7 supports 128 data transmission paths (or, data input/output path) (i.e., when there are 128 data pins corresponding to each of the channels CH0 to CH7), the stacked memory device 300 may support 1024 data transmission paths. However, the example embodiment is not limited thereto, and the stacked memory device 300 may support 1024 or more data transmission paths, and may support 8 or more channels (e.g., 16 channels). For example, when the stacked memory device 300 supports 1024 data transmission paths and 16 channels, each of the channels may support 64 data transmission paths.

Each of the core dies 320 to 350 may support at least one channel. For example, as shown in FIG. 13, each of the core dies 320 to 350 may support two channels CH0-CH2, CH1-CH3, CH4-CH6, or CH5-CH7. In this case, the core dies 320 to 350 may support different channels. However, the example embodiment is not limited thereto, and at least two of the core dies 320 to 350 may support the same channel. For example, two of the core dies 320 to 350 may support the first channel CH0.

Each of the channels can constitute an independent command and data interface. For example, each channel may be independently clocked based on independent timing requirements, and may not be synchronized with each other.

Each of the channels may include a plurality of memory banks 301. Each of the memory banks 301 may include memory cells connected to word lines and bit lines, a row decoder, a column decoder, a sense amplifier, and the like. For example, each of the memory banks 301 may correspond to the memory bank 220 of FIG. 1. For example, as shown in FIG. 13, each of the channels CH0 to CH7 may include eight memory banks 301. However, the example embodiment is not limited thereto, and each of the channels CH0 to CH7 may include eight or more memory banks 301. FIG. 13 shows that memory banks included in one channel are included in one core die, but memory banks included in one channel may be distributed in a plurality of core dies. For example, when the core dies 320 and 340 support the first channel CH0, memory banks included in the first channel CH0 may be distributed in the core dies 320 and 340.

In an example embodiment, one channel may be divided into two independently operated pseudo channels. For example, the pseudo channels may share the command and clock inputs (e.g., a clock signal CK and/or a clock enable signal CKE) of the channel, but may independently decode and execute commands. For example, when one channel supports 128 data transmission paths, each of the pseudo channels may support 64 data transmission paths. For example, when one channel supports 64 data transmission paths, each of the pseudo channels may support 32 data transmission paths.

The buffer die 310 and the core dies 320 to 350 may include a TSV region 302. TSVs configured to pass through the dies 310 to 350 may be disposed in the TSV region 302. The buffer die 310 may transmit/receive input/output signals to and from the core dies 320 to 350 through TSVs. Each of the core dies 320 to 350 may transmit/receive input/output signals to and from the buffer die 310 and other core dies through TSVs. In an example embodiment, input/output signals may be independently transmitted/received through TSVs corresponding to each channel. For example, when an external host device (e.g., the memory controller 100 of FIG. 1) transmits a data signal through the first channel CH0 in order to store data in the memory cell of the first channel CH0, the buffer die 310 may transmit a data signal to the first core die 320 through TSVs corresponding to the first channel CH0 to store data in a memory cell of the first channel CH0.

The buffer die 310 may include a physical layer (PHY) 311. The physical layer 311 may include interface circuits for communication with a host device. In an example embodiment, the physical layer 311 may include an interface circuit corresponding to each of the channels CH0 to CH7.

For example, each interface circuit may correspond to the memory interface circuit 210 described with reference to FIGS. 1 to 12. Input/output signals received from the host device through the physical layer 311 may be transmitted to the core dies 320 to 350 through TSVs.

In an example embodiment, the buffer die 310 may include a channel controller corresponding to each of the channels. The channel controller may manage memory reference operations of a corresponding channel and may determine a timing requirement condition of a corresponding channel.

In an example embodiment, the stacked memory device 300 may include a plurality of pins for transmitting/receiving input/output signals to or from the host device. For example, a plurality of pins may be attached to the buffer die 310. As described with reference to FIGS. 1 to 12, the physical layer 311 of the buffer die 310 may receive a clock signal CK, command/address signals CA, a write data strobe signal WDQS, and data signals DQ from the host device through a plurality of pins, and transmit a read data strobe signal RDQS and data signals DQ to the host device. For example, the stacked memory device 300 may include two write data strobe pins for receiving the write data strobe signal WDQS, and two read data strobe pins for transmitting the read data strobe signal RDQS in correspondence to 32 data pins for transmitting and receiving data signals DQ.

In an example embodiment, the stacked memory device 300 may further include an Error Correction Code (ECC) circuit for detecting and correcting an error in data. For example, in a write operation, the ECC circuit may generate parity bits for data transmitted from the host device. In the read operation, the ECC circuit may detect and correct an error of data transmitted from one of the core dies 320 to 350 using parity bits, and transmit the error-corrected data to the host device.

In an example embodiment, as described with reference to FIGS. 1 to 12, data pins for transmitting and receiving data signals DQ may be divided into at least two pin groups, and training may be performed for each pin group by the host device. Accordingly, the host device may determine the transmission timing and receiving timing corresponding to one pin group through training. In this case, the buffer die 310 of the stacked memory device 300 may be configured to support training of the host device. Hereinafter, the configuration of the buffer die 310 for supporting training of the host device will be described with reference to FIG. 14.

Figure 14:
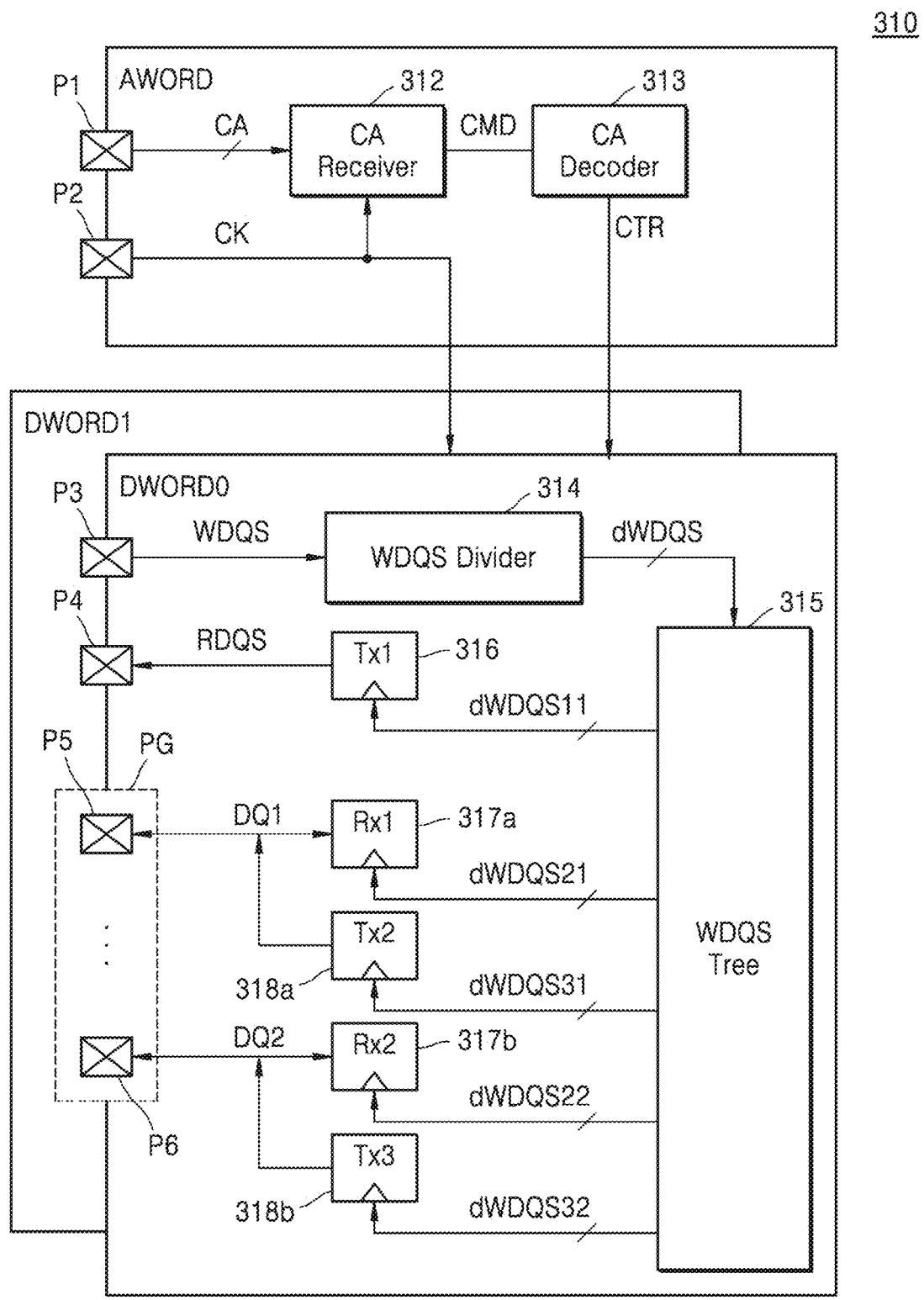
FIG. 14 is a block diagram showing an example embodiment of the buffer die of FIG. 13.

FIG. 14 is a block diagram showing an example embodiment of the buffer die of FIG. 13. Referring to FIG. 14, the buffer die 310 may include a command address input/output block AWORD and data input/output blocks DWORD0 and DWORD1. The command address input/output block AWORD and the data input/output blocks DWORD0 and DWORD1 may be included in an interface circuit corresponding to one of the plurality of channels. In FIG. 14, it is described that the buffer die 310 includes two data input/output blocks DWORD0 and DWORD1, but the buffer die 310 may include various numbers of data input/output blocks.

The command address input/output block AWORD may include a CA receiver 312 and a command decoder 313. The CA receiver 312 may sample each of the command/address signals CA received from the first pins P1 based on the clock signal CK received from the second pin P2 to obtain the command CMD. The command decoder 313 may generate the control signal CTR based on the command CMD and transmit the control signal CTR to the data input/output blocks DWORD0 and DWORD1, respectively. Components of the data input/output blocks DWORD0 and DWORD1 may operate in response to the control signal CTR. The clock signal CK may be transmitted to each of the data input/output blocks DWORD0 and DWORD1.

The data input/output block DWORD0 may include a WDQS divider 314, a WDQS tree 315, a first transmitter 316, first and second receivers 317a and 317b, and second and third transmitters 318a and 318b. The WDQS tree 315 may correspond to the WDQS tree 211 described with reference to FIGS. 7 and 10, and the first transmitter 316 may correspond to the transmitter 214 of FIG. 10. The first and second receivers 317a and 317b correspond to the first receiver group 212 of FIG. 7, and the second and third transmitters 318a and 318b may correspond to the first transmitter group 215 of FIG. 10. For convenience of explanation, the configuration of the buffer die 310 is described based on the data input/output block DWORD0, and the data input/output block DWORD0 and the data input/output block DWORD1 may be configured identically.

The WDQS divider 314 may generate internal write data strobe signals dWDQS based on the write data strobe signal WDQS received from the third pin P3. For example, the WDQS divider 314 may generate internal write data strobe signals dWDQS toggling with different phases based on the write data strobe signal WDQS. In this case, the frequency of each of the internal write data strobe signals dWDQS may be smaller than the frequency of the write data strobe signal WDQS.

The WDQS tree 315 may transmit internal write data strobe signals dWDQS to the receivers 317a and 317b and the transmitters 316, 318a, 318b of the data input/output block DWORD0 through a plurality of repeaters. Accordingly, each of the internal write data strobe signals dWDQS11, dWDQS21, dWDQS22, dWDQS31, and dWDQS32 provided to the first transmitter 316, the first and second receivers 317a and 317b, and the second and third transmitters 318a and 318b may be signals in which the internal write data strobe signals dWDQS are delayed by the WDQS tree 315. For example, the internal write data strobe signals dWDQS11 may be provided to the first transmitter 316 through repeaters on the first path, and the internal write data strobe signals dWDQS21, dWDQS22, dWDQS31, and dWDQS32 may be provided to the first and second receivers 317a and 317b, and the second and third transmitters 318a and 318b through repeaters on the second path. In this case, toggle timing of the internal write data strobe signals dWDQS21, dWDQS22, dWDQS31, and dWDQS32 may be the same. Accordingly, the toggle timing skew between the internal write data strobe signals dWDQS21, dWDQS22, dWDQS31, and dWDQS32 can be minimized.

FIG. 14 illustrates that internal write data strobe signals dWDQS generated from the write data strobe signal WDQS are transmitted by the WDQS tree 315, but the example embodiment is not limited thereto. For example, as described with reference to FIGS. 1 to 12, the write data strobe signal WDQS may be transmitted by the WDQS tree 315.

The first transmitter 316 may generate a read data strobe signal RDQS based on toggle timing of the internal write data strobe signals dWDQS11. The read data strobe signal RDQS may be transmitted to the host device through the fourth pin P4.

The first receiver 317a may sample the first data signal DQ1 received from the fifth pin P5 of the pin group PG based on toggle timing of the internal write data strobe signals dWDQS21. The second receiver 317b may sample the second data signal DQ2 received from the sixth pin P6 of the pin group PG based on toggle timing of the internal write data strobe signals dWDQS22. For example, when the toggle timing of the internal write data strobe signals dWDQS21 and the internal write data strobe signals dWDQS22 are the same, the first and second receivers 317a and 317b may sample the first data signal DQ1 and the second data signal DQ2 at the same time. As described with reference to FIGS. 1 to 12, since the first data signal DQ1 and the second data signal DQ2 from the host device are inputted at the same timing through the fifth pin P5 and the sixth pin P6 according to the training result for the pin group PG, even if the first data signal DQ1 and the second data signal DQ2 are sampled at the same time, the data bit error rate may be optimized.

The second transmitter 318a may transmit the first data signal DQ1 to the host device through the fifth pin P5 of the pin group PG based on toggle timing of the internal write data strobe signals dWDQS31. The third transmitter 318b may transmit the second data signal DQ2 to the host device through the sixth pin P6 of the pin group PG based on toggle timing of the internal write data strobe signals dWDQS33. For example, when the toggle timing of the internal write data strobe signals dWDQS31 and the internal write data strobe signals dWDQS32 are the same, the second transmitter 318a and the third transmitter 318b may transmit the first data signal DQ1 and the second data signal DQ2 to the host device at the same time. And the first data signal DQ1 and the second data signal DQ2 may reach the host device at same time. Accordingly, even if the host device samples the first data signal DQ1 and the second data signal DQ2 at the same time according to the training result for the pin group PG, the data bit error rate can be optimized.

FIG. 14 illustrates that the data input/output block DWORD0 transmits and receives data signals through one pin group PG, but the example embodiment is not limited thereto. For example, the data input/output block DWORD0 may transmit/receive data signals through at least two or more pin groups, as described with reference to FIGS. 3 to 12.

Figure 15:
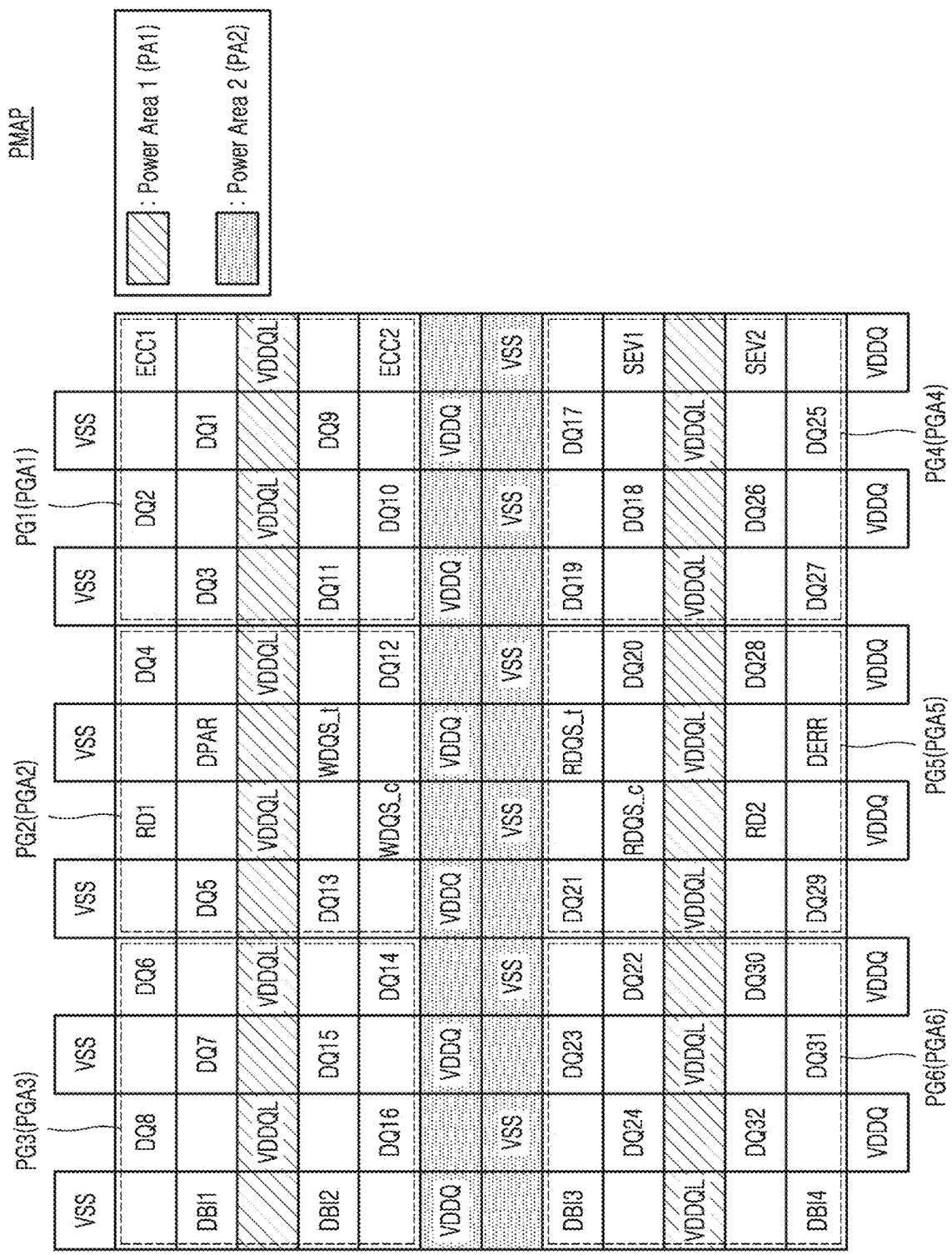
FIG. 15 shows an example pin map of pins included in the stacked memory device of FIG. 13.

FIG. 15 shows an example pin map of pins included in the stacked memory device of FIG. 13. Specifically, the pin map PMAP of FIG. 15 may correspond to one data input/output block DWORD of one channel.

Referring to FIGS. 13 and 15, a ground voltage VSS and power voltages VDDQ and VDDQL may be supplied to the physical layer 311 through pins of a pin map PMAP. Also, the physical layer 311 may receive input/output signals such as first to 32nd data signals DQ1 to DQ32, first and second error correction code signals ECC1 and ECC2, data parity signal DPAR, first and second redundant data signals RD1 and RD2, write data strobe signals WDQS_t and WDQS_c, first to fourth data bus inversion signals DBI1 to DBI4, first and second error severity signals SEV1 and SEV2, and a data error signal DERR from the host device or transmit the input/output signals to the host device through pins in the pin map PMAP.

The power supply voltage VDDQ may be a voltage used for the overall operation of the buffer die 310, and the power supply voltage VDDQL may be a voltage used to transmit input/output signals from the buffer die 310 to the core dies 320 to 350 through a TSV. In an example embodiment, the power voltage VDDQ may be greater than the power voltage VDDQL. For example, the power voltage VDDQ may be 1.1V, and the power voltage VDDQL may be 0.4V.

Each of the first to 32nd data signals DQ1 to DQ32 may be a signal for transmitting data. Each of the first and second error correction code signals ECC1 and ECC2 may be a signal for controlling enable or disable of the ECC circuit. The data parity signal DPAR may include a parity bit associated with data included in the data signals DQ1 to DQ32. The first and second redundant data signals RD1 and RD2 may be signals for transmitting additional data other than the data included in the first to 32nd data signals DQ1 to DQ32. The write data strobe signals WDQS_t and WDQS_c may be received from the host device as a differential pair. The first to fourth data bus inversion signals DBI1 to DBI4 may be signals indicating whether code inversion encoding is applied to the first to 32nd data signals DQ1 to DQ32. The first and second error severity signals SEV1 and SEV2 may be signals indicating an amount of error when an error of data is detected based on a parity bit. The data error signal DERR may be a signal indicating whether an error is detected according to the error detection by the ECC circuit. Input/output signals including data signals DQ1 to DQ32 may be sampled based on write data strobe signals WDQS_t and WDQS_c or transmitted to a host device, as described with reference to FIGS. 1 to 12.

Pins for transmitting/receiving input/output signals of a pin map PMAP may be divided into a plurality of pin groups. In this case, each of the pin groups may include pins for transmitting and receiving one or more data signals DQ and one or more control signals (e.g., WDQS, RDQS, DBI, DPAR, ECC, DERR, SEV, and the like). For example, as shown in FIG. 15, pins for transmitting and receiving input/output signals of the pin map PMAP may be divided into first to sixth pin groups PG1 to PG6.

The first to sixth pin groups PG1 to PG6 may be disposed in the first to sixth regions PGA1 to PGA6, respectively. The first to sixth regions PGA1 to PGA6 may include the power area PA1. Pins for receiving the power voltage VDDQL may be disposed in the power area PA1. In an example embodiment, the pins of each of the first to sixth pin groups PG1 to PG6 may be disposed to be symmetrical with respect to the power area PA1. For example, the pins DQ1, DQ2, DQ3, and ECC1 of the first pin group PG1 and the pins DQ9, DQ10, DQ11, and ECC2 of the first pin group PG1 may be disposed to be symmetrical with respect to the power area PA1. However, the example embodiment is not limited thereto.

The power area PA2 may be positioned between the first to third regions PGA1 to PGA3 and the fourth to sixth regions PGA4 to PGA6. Pins for receiving the power voltage VDDQ and the ground voltage VSS may be disposed in the power area PA2. That is, the first to third regions PGA1 to PGA3 and the fourth to sixth regions PGA4 to PGA6 may be symmetrically positioned with respect to the power area PA2.

Each of the first to sixth pin groups PG1 to PG6 may include pins for transmitting and receiving one or more data signals DQ and one or more control signals. In this case, the pin arrangement structures of the first to third pin groups PG1 to PG3 may be the same, and the pin arrangement structures of the fourth to sixth pin groups PG4 to PG6 may be the same. In addition, the second pin group PG2 includes pins for receiving write data strobe signals WDQS_t and WDQS_c, and the remaining pin groups PG1 and PG3 to PG6 may not include pins for receiving write data strobe signals WDQS_t and WDQS_c. FIG. 15 shows that each of the pin groups include at least or exactly eight pins for transmitting and receiving input/output signals (i.e., data signals DQ and control signals), but the example embodiment is not limited thereto, and the number and type of pins included in one pin group may be variously changed.

For each of the first to sixth pin groups PG1 to PG6, training may be performed for each pin group, as described with reference to FIGS. 1 to 12. For example, transmission timing and/or receiving timing corresponding to the pin group may be determined through training on one of the pin groups. Accordingly, a training value (e.g., transmission timing of input/output signals or receiving timing of input/output signals) corresponding to one pin group may be determined identically.

Each of the data signals DQ transmitted and received through one pin group may be sampled at the same time or transmitted to the host device at the same time, as described with reference to FIGS. 1 to 12. For this, the internal write data strobe signals dWDQS generated from the write data strobe signals WDQS_t and/or WDQS_c may be respectively reached to each of the transmitters and each of the receivers for transmitting and receiving (i.e. sampling) data signals DQ according to the same delay time by the WDQS tree (e.g., the WDQS tree 315 in FIG. 14). For example, the internal write data strobe signals dWDQS may be reached to each of the transmitters and each of the receivers for transmitting and receiving data signals DQ1, DQ2, DQ3, DQ9, DQ10, and DQ11 according to the same delay time.

Figure 16:
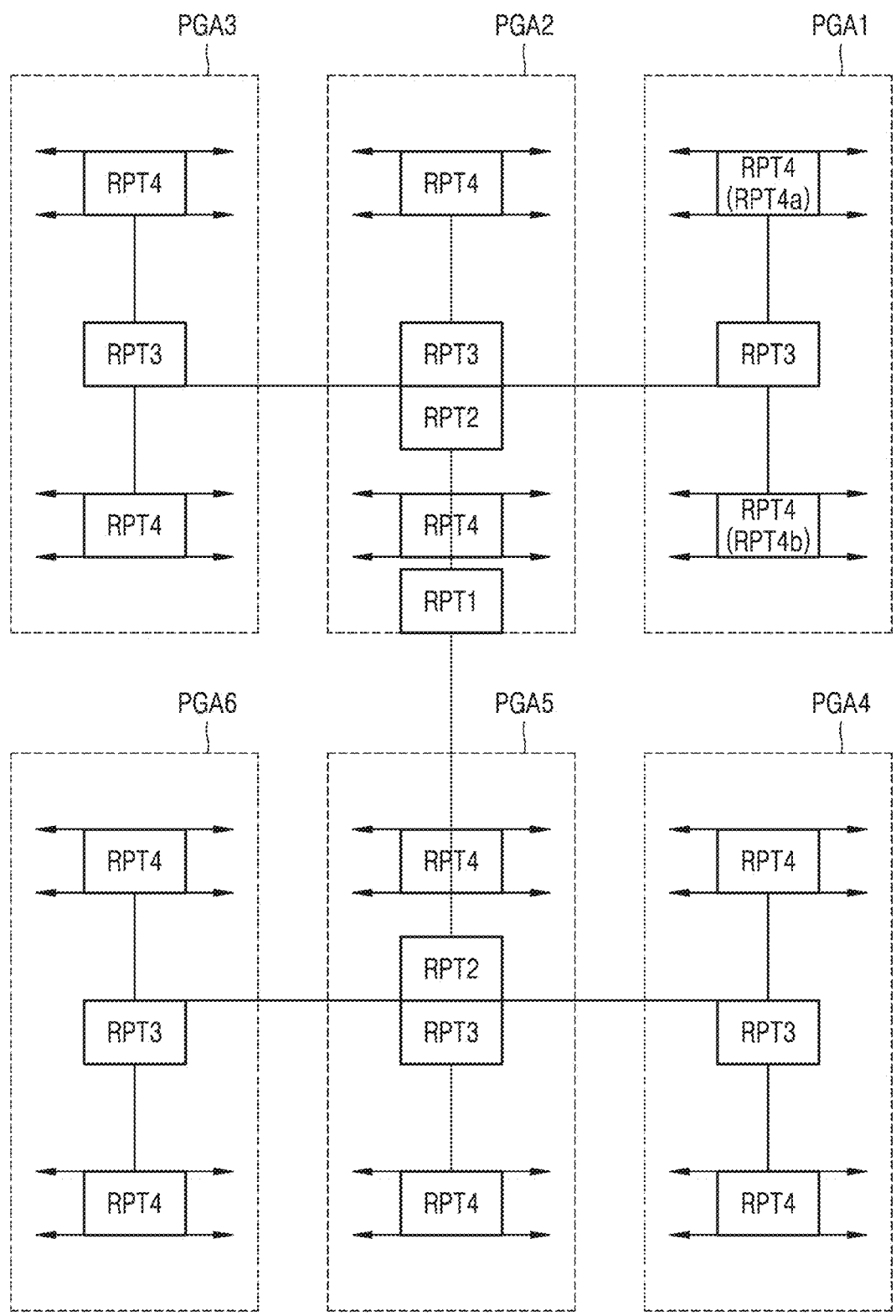
FIG. 16 shows an example configuration of a WDQS tree corresponding to the pin map of FIG. 15.

FIG. 16 shows an example configuration of a WDQS tree corresponding to the pin map of FIG. 15. Referring to FIGS. 15 and 16, the WDQS tree WTREE may include a plurality of repeaters RPT1 to RPT4. The plurality of repeaters RPT1 to RPT4 may be disposed on a region in which pins of the pin map PMAP are arranged. For example, the plurality of repeaters RPT1 to RPT4 may be disposed on the first to sixth regions PGA1 to PGA6. For example, the repeaters RPT1 to RPT4 may transmit the write data strobe signal WDQS to circuits (e.g., a transmitter and a receiver) on each region by an H-tree method.

The first repeater RPT1 may receive internal write data strobe signals dWDQS generated from write data strobe signals WDQS_t and/or WDQS_c, and transmit the internal write data strobe signals dWDQS to the second repeaters RPT2. Each of the second repeaters RPT2 may transmit internal write data strobe signals dWDQS transmitted from the first repeater RPT1 to the third repeaters RPT3. For example, the second repeater RPT2 disposed in the second region PGA2 transmits the internal write data strobe signals dWDQS to the third repeaters RPT3 disposed in the first to third regions PGA1 to PGA3.

Each of the third repeaters RPT3 may transmit internal write data strobe signals dWDQS transmitted from the second repeater RPT2 to the fourth repeaters RPT4. For example, the third repeater RPT3 disposed in the first region PGA1 transmits the internal write data strobe signals dWDQS to the fourth repeaters RPT4a and RPT4b disposed in the first region PGA1.

Each of the fourth repeaters RPT4 may transmit the internal write data strobe signals dWDQS transmitted from the third repeater RPT3 to adjacent transmitters and receivers. For example, the fourth repeater RPT4a may transmit internal write data strobe signals dWDQS to each of the transmitters and each of the receivers for transmitting and receiving data signals DQ1, DQ2, and DQ3. The fourth repeater RPT4b may transmit the internal write data strobe signals dWDQS to each of the transmitters and each of the receivers for transmitting and receiving data signals DQ9, DQ10, and DQ11. In this case, the fourth repeaters RPT4a and RPT4b may be arranged such that internal write data strobe signals dWDQS are reached to the each of the transmitters and each of the receivers according to the same delay time. For example, the fourth repeaters RPT4a and RPT4b may be disposed to have the same distance from the third repeater RPT3 of the first region PGA1. Accordingly, the internal write data strobe signals dWDQS are reached at the same timing to each of the transmitters and each of the receivers for transmitting and receiving data signals DQ1, DQ2, DQ3, DQ9, DQ10, and DQ11 through repeaters on different paths.

In an example embodiment, repeaters on two of the regions PGA1 to PGA6 may be arranged to be symmetrical with respect to the power area PA2 of FIG. 15. For example, the third repeaters RPT3 and the fourth repeaters RPT4 on the first region PGA1 and the third repeaters RPT3 and fourth repeaters RPT4 on the fourth region PGA4 may be arranged to be symmetric with respect to the power area PA2. In this case, the layouts of the repeaters RPT3 and RPT4 on the first region PGA1 and the layouts of the repeaters RPT3 and RPT4 on the fourth region PGA4 may be the same. In this way, layouts of circuits disposed on two of the regions PGA1 to PGA6 may be the same.

In an example embodiment, repeaters on two of the regions PGA1 to PGA6 may be arranged to be symmetrical with respect to the power area PA2 of FIG. 15. For example, the fourth repeaters RPT4 on the first region PGA1 may be disposed to be symmetrical with respect to the power area PA1.

As described above, when the internal write data strobe signals dWDQS are transmitted based on the plurality of repeaters RPT1 to RPT4, each of the data signals DQ received through one data pin group may be sampled at the same time, and each of the data signals DQ may be transmitted to the host device at the same time through one data pin group.

FIG. 16 shows that the transmission timing of the internal write data strobe signals dWDQS is controlled through the same number of repeaters (e.g., four repeaters RPT1 to RPT4), but the example embodiment is not limited thereto. For example, by setting the drive capability of repeaters differently or by using a separate resistor or a circuit element such as a capacitor, toggle timing of the internal write data strobe signals dWDQS transmitted to each of the transmitters and each of the receivers may be adjusted. Accordingly, the sampling timing skew in the write operation and/or data skew in the read operation may be compensated by adding dummy loads.

Figure 17:
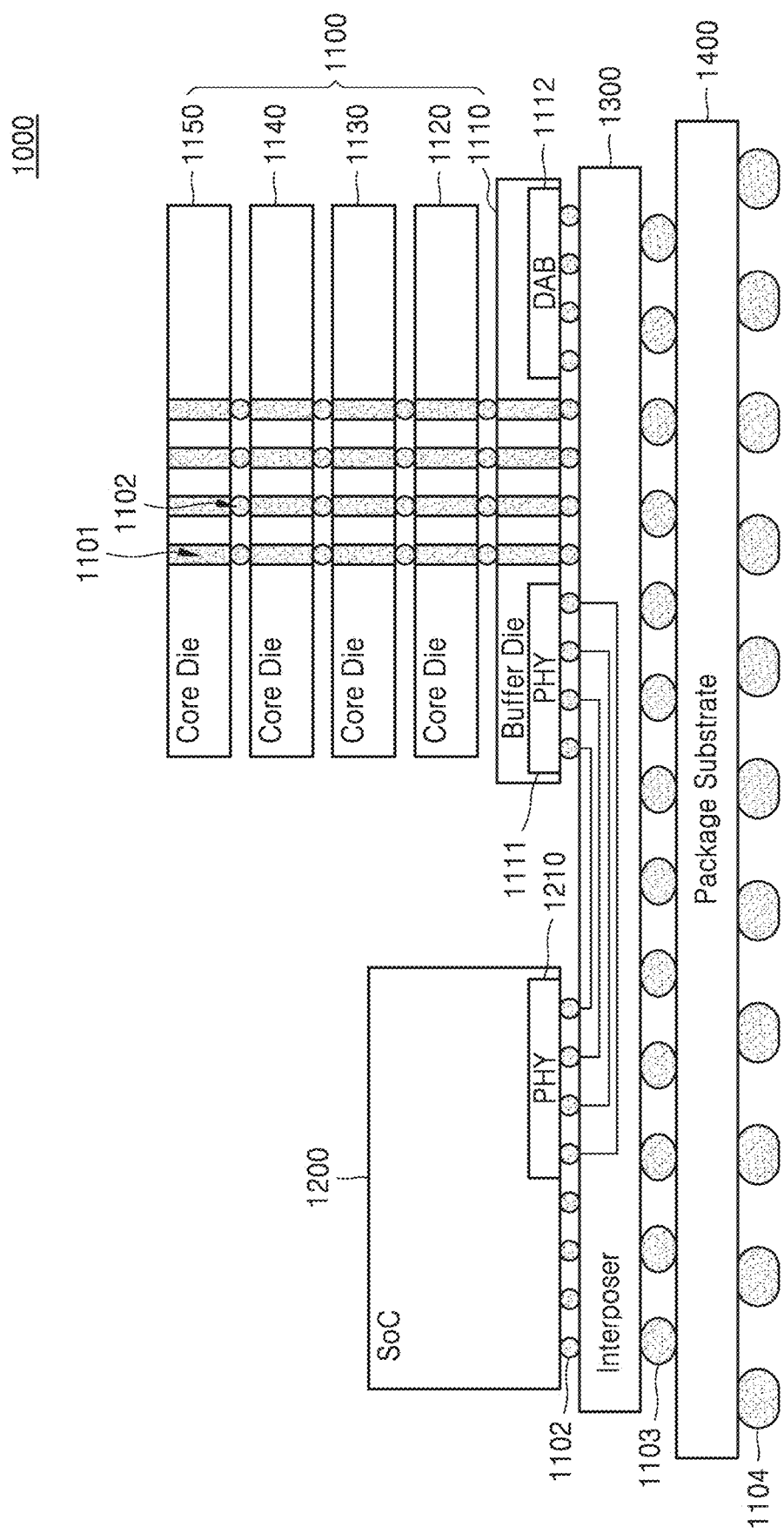
FIG. 17 is a diagram illustrating a semiconductor package according to an example embodiment.

FIG. 17 is a diagram illustrating a semiconductor package according to some example embodiments of inventive concepts. Referring to FIG. 17, the semiconductor package 1000 may include a stacked memory device 1100, a system-on-chip 1200, an interposer 1300, and a package substrate 1400. The stacked memory device 1100 may include a buffer die 1110 and core dies 1120 to 1150. The buffer die 1110 may correspond to the buffer die 310 of FIG. 13, and each of the core dies 1120 to 1150 may correspond to each of the core dies 320 to 350 of FIG. 13.

Each of the core dies 1120 to 1150 may include memory cells for storing data. The buffer die 1110 may include a physical layer 1111 and a direct access region (DAB) 1112. The physical layer 1111 may be electrically connected to the physical layer 1210 of the system-on-chip 1200 through the interposer 1300. The stacked memory device 1100 may receive input/output signals from the system-on-chip 1200 through the physical layer 1111 or may transmit input/output signals to the system-on-chip 1200. The physical layer 1111 may include the interface circuit of the buffer die 310 described with reference to FIG. 14.

The direct access region 1112 may provide an access path for testing the stacked memory device 1100 without going through the system-on-chip 1200. The direct access region 1112 may include conducting means (e.g., ports or pins) capable of direct communication with an external test device. The test signal received through the direct access region 1112 may be transmitted to the core dies 1120 to 1150 through TSVs. Data read from the core dies 1120 to 1150 for testing the core dies 1120 to 1150 may be transmitted to the test apparatus through TSVs and the direct access region 1112. Accordingly, a direct access test for the core dies 1120 to 1150 may be performed.

The buffer die 1110 and the core dies 1120 to 1150 may be electrically connected to each other through TSVs 1101 and bumps 1102. For example, the bumps 1102 may correspond to the pins described with reference to FIGS. 1 to 16. The buffer die 1110 may receive input/output signals provided to each channel from the system-on-chip 1200 through the bumps 1102 allocated for each channel, or transmit input/output signals to the system-on-chip 1200 through the bumps 1102. For example, the bumps 1102 may be micro bumps.

The system-on-chip 1200 may execute applications supported by the semiconductor package 1000 using the stacked memory device 1100. For example, the system-on-chip 1200 may include at least one processor among a Central Processing Unit (CPU), an Application Processor (AP), a Graphics Processing Unit (GPU), a Neural Processing Unit (NPU), a Tensor Processing Unit (TPU), a Vision Processing Unit (VPU), an Image Signal Processor (ISP), and a Digital Signal Processor (DSP) to execute specialized operations.

The system-on-chip 1200 may control the overall operation of the stacked memory device 1100. The system-on-chip 1200 may include a physical layer 1210. The physical layer 1210 may include an interface circuit for transmitting and receiving input/output signals to and from the physical layer 1111 of the stacked memory device 1100. For example, the system-on-chip 1200 and the physical layer 1210 may correspond to the memory controller 100 and the host interface circuit 110 described with reference to FIGS. 1 to 12, respectively. The system-on-chip 1200 may provide various input/output signals to the physical layer 1111 through the physical layer 1210. Signals provided to the physical layer 1111 may be transmitted to the core dies 1120 to 1150 through an interface circuit of the physical layer 1111 and the TSVs 1101.

The interposer 1300 may connect the stacked memory device 1100 and the system-on-chip 1200. The interposer 1300 may connect between the physical layer 1111 of the stacked memory device 1100 and the physical layer 1210 of the system-on-chip 1200, and provide physical paths formed using conductive materials. Accordingly, the stacked memory device 1100 and the system-on-chip 1200 are stacked on the interposer 1300 to transmit/receive input/output signals.

Bumps 1103 may be attached to an upper portion of the package substrate 1400, and solder balls 1104 may be attached to a lower portion of the package substrate 1400. For example, the bumps 1103 may be flip-chip bumps. The interposer 1300 may be stacked on the package substrate 1400 through the bumps 1103. The semiconductor package 1000 may transmit and receive signals with other external packages or semiconductor devices through the solder ball 1104. For example, the package substrate 1400 may be a printed circuit board (PCB).

In an example embodiment, the system-on-chip 1200 trains the bumps 1102 for transmitting input/output signals to the physical layer 1111 by each group, as described with reference to FIGS. 1 to 16. According to training, output timing of data signals outputted from the physical layer 1210 through one bump group of the system-on-chip 1200 may be the same. In order for the output data signals to reach the physical layer 1111 at the same timing, lengths of signal lines of the interposer 1300 connecting one bump group of the system-on-chip 1200 and the corresponding bump group of the stacked memory device 1100 may be the same.

Figure 18:
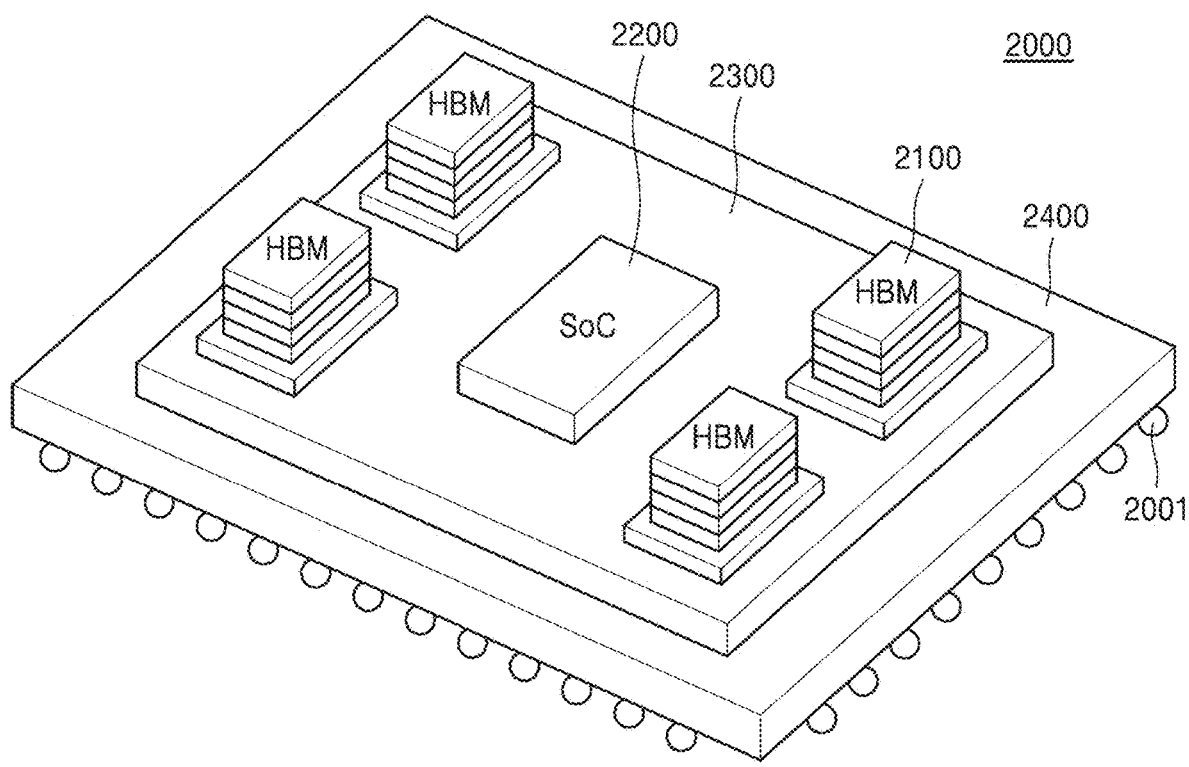
FIG. 18 is a diagram illustrating a semiconductor package according to an example embodiment.

FIG. 18 is a diagram illustrating a semiconductor package according to some example embodiments of inventive concepts. Referring to FIG. 18, the semiconductor package 2000 may include a plurality of stacked memory devices 2100 and a system-on-chip 2200. The stacked memory devices 2100 and the system-on-chip 2200 may be stacked on the interposer 2300, and the interposer 2300 may be stacked on the package substrate 2400. The semiconductor package 2000 may transmit and receive signals to and from other external packages or semiconductor devices through a solder ball 2001 attached under the package substrate 2400.

Each of the stacked memory devices 2100 may be implemented based on the HBM standard. However, the example embodiment is not limited thereto, and each of the stacked memory devices 2100 may be implemented based on GDDR, HMC, or Wide I/O standards. The stacked memory devices 2100 may correspond to the stacked memory devices 300 and 1100 of FIGS. 13 and 17, respectively.

The system-on-chip 2200 may include at least one processor such as a CPU, AP, GPU, and NPU, and a plurality of memory controllers for controlling the plurality of stacked memory devices 2100. Each of the memory controllers may correspond to the memory controller 100 of FIG. 1. The system-on-chip 2200 may transmit/receive input/output signals to and from a corresponding stacked memory device through a memory controller.

Figure 19:
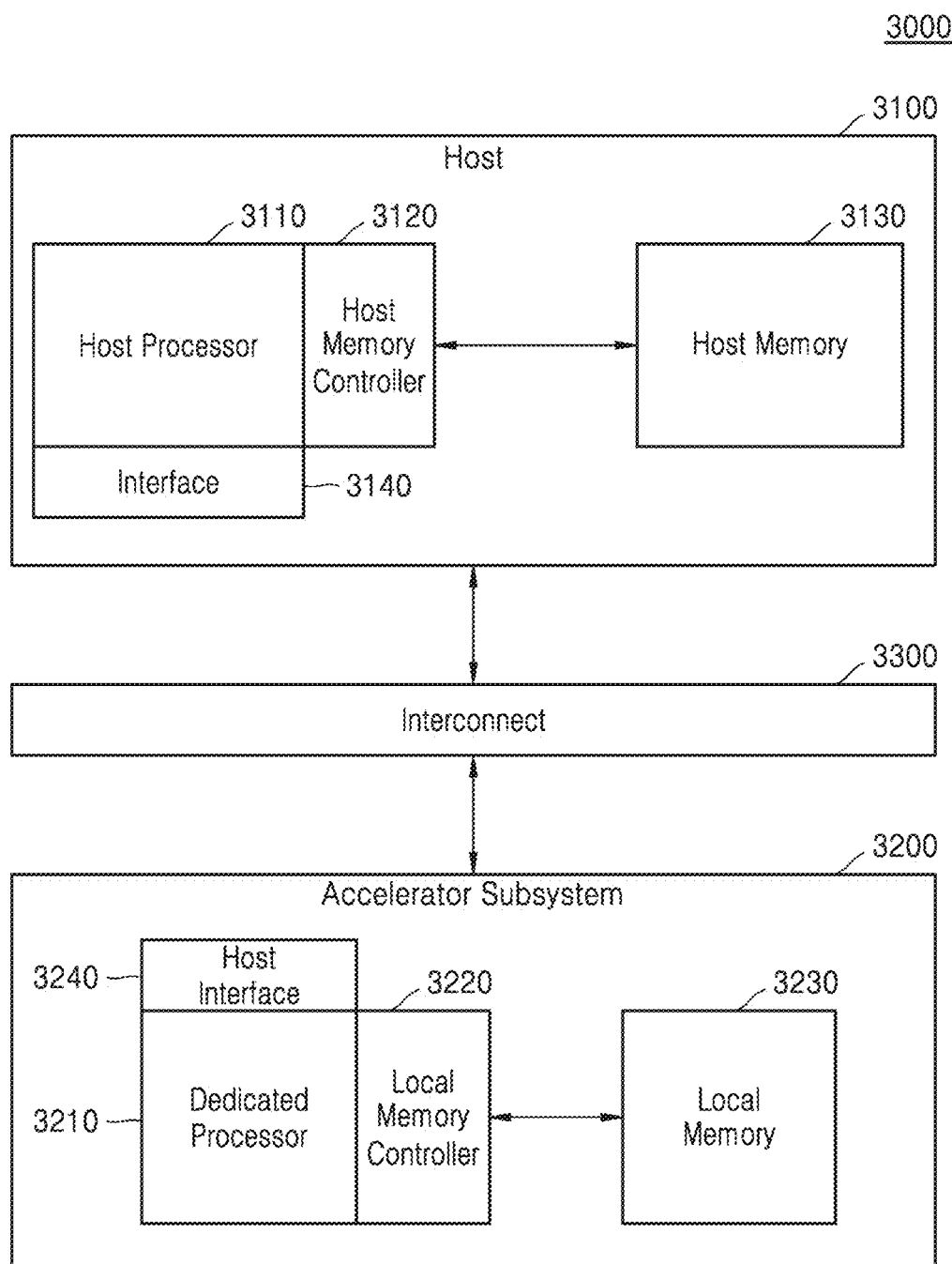
FIG. 19 is a block diagram illustrating a computing system according to an example embodiment.

FIG. 19 is a block diagram illustrating a computing system according to some example embodiments of inventive concepts. The computing system 3000 may be implemented as a single electronic device, or may be distributed and implemented on two or more electronic devices. For example, the computing system 3000 may be implemented with at least one of various electronic devices such as desktop computers, laptop computers, tablet computers, smartphones, autonomous vehicles, digital cameras, wearable devices, healthcare devices, server systems, data centers, drones, handheld game console, Internet of Things (IoT) devices, graphic accelerators, AI accelerators, and the like.

Referring to FIG. 19, the computing system 3000 may include a host 3100, an accelerator subsystem 3200, and an interconnect 3300. The host 3100 may control the overall operation of the accelerator subsystem 3200, and the accelerator subsystem 3200 may operate under the control of the host 3100. The host 3100 and the accelerator subsystem 3200 may be connected through the interconnect 3300. Various signals and data may be transmitted and received between the host 3100 and the accelerator subsystem 3200 through the interconnect 3300.

The host 3100 may include a host processor 3110, a host memory controller 3120, a host memory 3130, and an interface 3140. The host processor 3110 may control the overall operation of the computing system 3000. The host processor 3110 may control the host memory 3130 through the host memory controller 3120. The host processor 3110 may control the accelerator subsystem 3200 connected through the interconnect 3300. For example, the host processor 3110 may transmit a command to the accelerator subsystem 3200 to allocate a task to the accelerator subsystem 3200.

The host processor 3110 may be a general-purpose processor or a main processor that performs general operations related to various operations of the computing system 3000. For example, the host processor 3110 may be a CPU or an AP.

The host memory 3130 may be a main memory of the computing system 3000. The host memory 3130 may store data processed by the host processor 3110 or may store data received from the accelerator subsystem 3200. For example, the host memory 3130 may be implemented with DRAM.

The interface 3140 may be configured to allow the host 3100 to communicate with the accelerator subsystem 3200. The host processor 3110 may transmit control signals and data to the accelerator subsystem 3200 through the interface 3140 and may receive signals and data from the accelerator subsystem 3200. In an example embodiment, the host processor 3110, the host memory controller 3120, and the interface 3140 may be implemented as a single chip.

The accelerator subsystem 3200 may perform a specific function under the control of the host 3100. For example, the accelerator subsystem 3200 may perform operations specialized for a specific application under the control of the host 3100. The accelerator subsystem 3200 may be implemented in various forms such as a module, a card, a package, a chip, or a device so as to be physically or electrically connected to the host 3100, or may be connected to the host 3100 by wire or wirelessly. For example, the accelerator subsystem 3200 may be implemented as one of the semiconductor packages described with reference to FIGS. 17 and 18. For example, the accelerator subsystem 3200 may be implemented as a graphics card or accelerator card. For example, the accelerator subsystem 3200 may be implemented based on a Field Programmable Gate Array (FPGA) or an Application Specific Integrated Circuit (ASIC).

In an example embodiment, the accelerator subsystem 3200 may be implemented based on one of various packaging techniques. For example, the accelerator subsystem 3200 may be implemented with a packaging technique such as Ball Grid Arrays (BGAs), MCP (Multi Chip Package), SOP (System on Package), SIP (System in Package), POP (Package on Package), Chip scale packages (CSPs), wafer level package (WLP), or panel level package (PLP). As an example, some or all components of the accelerator subsystem 3200 may be connected through copper-to-copper bonding. As an example, some or all components of the accelerator subsystem 3200 may be connected through an interposer such as a silicon interposer, an organic interposer, a glass interposer, or an active interposer. As an example, some or all components of the accelerator subsystem 3200 may be stacked based on the TSV. As an example, some or all of the components of the accelerator subsystem 3200 may be connected through a high-speed connection passage (e.g., a silicon bridge).

The accelerator subsystem 3200 may include a dedicated processor 3210, a local memory controller 3220, a local memory 3230, and a host interface 3240. The dedicated processor 3210 may operate under the control of the host processor 3110. For example, the dedicated processor 3210 may read data from the local memory 3230 through the local memory controller 3220 in response to a command of the host processor 3110. The dedicated processor 3210 may process data by performing an operation based on the read data. The dedicated processor 3210 may transmit the processed data to the host processor 3110 or may write the processed data to the local memory 3230.

The dedicated processor 3210 may perform operations specialized for a specific application based on a value stored in the local memory 3230. For example, the dedicated processor 4210 may perform operations specialized for applications such as artificial intelligence, streaming analysis, video transcoding, data indexing, data encoding/decoding, and data encryption. Accordingly, the dedicated processor 3210 may process various types of data such as image data, voice data, motion data, biometric data, and key values. For example, the dedicated processor 3210 may include at least one of GPU, NPU, TPU, VPU, ISP, and DSP.

The dedicated processor 3210 may include one processor core, or may include a plurality of processor cores such as a dual core, a quad core, and a hexa core. In an example embodiment, the dedicated processor 3210 may include a larger number of cores than the host processor 3110 for an operation specialized in parallelism. For example, the dedicated processor 3210 may include 1000 or more cores.

The local memory controller 3220 may control the overall operation of the local memory 3230. In an example embodiment, the local memory controller 3220 may perform Error Correction Code (ECC) encoding and ECC decoding, or perform data verification using a cyclic redundancy check (CRC) method, or may perform data encryption and data decryption.

The local memory 3230 may be used exclusively by the dedicated processor 3210. In an example embodiment, the local memory 3230 may be implemented in various forms such as a die, a chip, a package, a module, a card, or a device to be mounted on one board together with the dedicated processor 3210, or connected to the dedicated processor 3210 based on a separate connector.

In an example embodiment, the local memory controller 3220 may correspond to the memory controller 100 of FIG. 1, and the local memory 3230 may correspond to the memory device 200 of FIG. 1 and the stacked memory device 300 of FIG. 13. Accordingly, the local memory controller 3220 may perform training for each group on the pins of the local memory 3230, and the local memory controller 3220 and the local memory 3230 may be configured to support group-specific training.

In an example embodiment, the local memory 3230 may include a logic circuit capable of performing some operations. The logic circuit may perform a linear operation, a comparison operation, a compression operation, a data conversion operation, an arithmetic operation, or the like on data read from the local memory 3230 or data to be written to the local memory 3230. Accordingly, the size of data processed by the logic circuit can be reduced. When the data size is reduced, bandwidth efficiency between the local memory 3230 and the local memory controller 3220 may be improved.

The host interface 3240 may be configured such that the accelerator subsystem 3200 communicates with the host 3100. The accelerator subsystem 3200 may transmit signals and data to the host 3100 through the host interface 3240 and may receive control signals and data from the host 3100. In an example embodiment, the dedicated processor 3210, the local memory controller 3220, and the host interface 3240 may be implemented as a single chip.

The interconnect 3300 provides a data transmission path between the host 3100 and the accelerator subsystem 3200, and may serve as a data bus or data link. The data transmission path may be formed by wire or wireless. The interface 3140 and the host interface 3240 may communicate based on a predetermined protocol through the interconnect 3300. For example, the interfaces 3140 and 3240 may communicate based on one of various standards such as Advanced Technology Attachment (ATA), Serial ATA (SATA), external SATA (e-SATA), Small Computer Small Interface (SCSI), Serial Attached SCSI (SAS), Peripheral Component Interconnection (PCI), PCI express (PCIe), NVM express (NVMe), Advanced eXtensible Interface (AXI), ARM Microcontroller Bus Architecture (AMBA), IEEE 1394, universal serial bus (USB), secure digital (SD) card, multi-media card (MMC), embedded multi-media card (eMMC), Universal Flash Storage (UFS), compact flash (CF), Gen-Z, and the like. Alternatively, the interfaces 3140 and 3240 may communicate based on a communication link between devices such as open Coherent Accelerator Processor Interface (CAPI), Cache Coherent Interconnect for Accelerators (CCIX), Compute Express Link (CXL), and NVLINK. Alternatively, the interfaces 4140 and 4240 may communicate based on a wireless communication technology such as LTE, 5G, LTE-M, NB-IoT, LPWAN, Bluetooth, Near Field Communication (NFC), Zigbee, Z-Wave, WLAN, and the like.

In an example embodiment, the accelerator subsystem 3200 may further include a sensor capable of detecting image data, voice data, motion data, biometric data, and surrounding environment information. When the sensor is included in the accelerator subsystem 3200, the sensor may be connected to other components (e.g., the dedicated processor 3210 and the local memory 3230) based on the above-described packaging technique. The accelerator subsystem 3200 may process data sensed through a sensor based on specific operations.

FIG. 19 shows that the dedicated processor 3210 uses one local memory 3230 through one local memory controller 3220, but the example embodiment is not limited thereto. As an example, the dedicated processor 3210 may use a plurality of local memories through one local memory controller 3220. As another example, the dedicated processor 3210 may use a local memory corresponding to each of the plurality of local memory controllers. As another example, the dedicated processor 3210 may use a local memory corresponding to each of the plurality of local memory controllers.

Certain elements described herein such as a "controller" or a "tree" or a "repeater" or a "unit block", and/or certain elements ending in "-er" or "-or", may be embodied as hardware or a combination of hardware and software. For example, elements may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts has been particularly shown and described with reference to embodiments thereof, it will be understood that various changes in form and details may be made therein without departing from the spirit and scope of the following claims.

What is claimed is:

1. A memory device comprising:
   first power pins disposed in a first power area and configured to receive a first power voltage;
   data pins configured to transmit or receive data signals, the data pins being disposed in a first region and a second region, the first region and the second region each including a portion of the first power area;

control pins configured to transmit or receive control signals, the control pins being disposed in the first region and the second region;

second power pins disposed in a second power area between the first region and the second region, the second power pins configured to receive a second power voltage different from the first power voltage; and ground pins disposed in the second power area and configured to receive a ground voltage, wherein the data pins and the control pins are divided into a plurality of pin groups, and wherein a training value including transmission timing or receiving timing for each pin group of the plurality of pin groups is determined based on training at least one pin from each group of the plurality of pin groups.

2. The memory device of claim 1, wherein control pins of a first pin group from among the plurality of pin groups comprise a pin configured to receive a write data strobe signal, and control pins of a second pin group from among the plurality of pin groups do not comprise the pin configured to receive the write data strobe signal.

3. The memory device of claim 2, wherein the memory device is configured to sample the data signals and the control signals based on the write data strobe signal.

4. The memory device of claim 2, wherein the memory device is configured to transmit the data signals and the control signals based on the write data strobe signal.

5. The memory device of claim 2, further comprising:
a plurality of repeater circuitries configured to transmit the write data strobe signal to a region in which the second pin group is located.

6. The memory device of claim 5, wherein from among the plurality of repeater circuitries, a first repeater circuitry and a second repeater circuitry are arranged to be symmetrical with respect to the first power area.

7. The memory device of claim 2, wherein the control pins of the second pin group comprise a pin configured to transmit or to receive at least one of an error correction code signal, a data parity signal, a data bus inversion signal, an error severity signal, and a data error signal.

8. The memory device of claim 1, wherein the first power voltage is less than the second power voltage.

9. The memory device of claim 1, wherein pins of each of the plurality of pin groups are arranged to be symmetrical with respect to the first power area.

10. The memory device of claim 1, wherein each of the plurality of pin groups comprises at least eight pins.

11. A memory device comprising:
a first pin group including a first data pin configured to transmit or receive a first data signal and a first control pin configured to transmit or receive a first control signal;
a second pin group including a second data pin configured to transmit or receive a second data signal and a second control pin configured to transmit or receive a second control signal;
a third control pin configured to receive a write data strobe signal;
first power pins configured to receive a first power voltage, the first power pins being located in a first power area positioned in each of a first region in which the first pin group is located and a second region in which the second pin group is located;
second power pins configured to receive a second power voltage different from the first power voltage, the second power pins being located in a second power area positioned between the first region and the second region;
ground pins configured to receive a ground voltage, the ground pins being located in the second power area; and
a write data strobe tree circuitry configured to transmit a first internal write data strobe signal with a first toggle timing to a first circuit block corresponding to the first pin group and to transmit a second internal write data strobe signal with a second toggle timing to a second circuit block corresponding to the second pin group, based on the write data strobe signal,
wherein the first toggle timing is different from the second toggle timing.

12. The memory device of claim 11, wherein pins of the first pin group and pins of the second pin group are arranged to be symmetrical with respect to the second power area.

13. The memory device of claim 11, wherein a first training value including transmission timing or receiving timing of the first pin group is determined based on training one of the first data pin and the first control pin, and a second training value including transmission timing or receiving timing of the second pin group is determined based on training one of the second data pin and the second control pin.

14. The memory device of claim 11, wherein the first circuit block configured to receive the first data signal and the first control signal transmitted through the first pin group and to sample the first data signal and the first control signal based on the first internal write data strobe signal, and
the second circuit block configured to receive the second data signal and the second control signal transmitted through the second pin group and to sample the second data signal and the second control signal based on the second internal write data strobe signal.

15. The memory device of claim 11, wherein the write data strobe tree circuitry includes first repeater circuitries on the first region and second repeater circuitries on the second region, and the first repeater circuitries and the second repeater circuitries are arranged symmetrical with respect to the second power area.

16. The memory device of claim 11, wherein a layout of circuits on the first region is the same as a layout of circuits on the second region.

17. A memory device comprising:
a write data strobe pin configured to receive a write data strobe signal;
a first pin group configured to receive first data signals sampled based on the write data strobe signal; and
a second pin group configured to receive second data signals sampled based on the write data strobe signal,
wherein a first training value of the first pin group is determined based on training a first pin of the first pin group, and
a second training value of the second pin group of pins is determined based on training a second pin of the second pin group.

18. The memory device of claim 17, further comprising:
a first receiver group configured to receive the first data signals transmitted through the first pin group;
a second receiver group configured to receive the second data signals transmitted through the second pin group; and
a write data strobe tree circuitry configured to transmit a first internal write data strobe signal to the first receiver group through repeater circuitries on a first path and to transmit a second internal write data strobe signal to the second receiver group through repeater circuitries on a second path, based on the write data strobe signal transmitted through the write data strobe pin, wherein the first receiver group is configured to sample the first data signals based on toggle timing of the first internal write data strobe signal, and the second receiver group is configured to sample the second data signals based on toggle timing of the second internal write data strobe signal.

19. The memory device of claim 18, wherein receivers of the first receiver group are arranged at the same distance from a repeater circuitry of the repeater circuitries located last on the first path.

20. The memory device of claim 18, wherein lengths of signal lines that transmit the first data signals from the first group of pins to the first receiver group are the same.

* * * * *